US012779462B2

(12) United States Patent
Kotani et al.

(10) Patent No.: US 12,779,462 B2

(45) Date of Patent: Nov. 3, 2026

(54) STRUCTURE COMPRISING MICROCHANNEL, PRODUCTION METHOD FOR SAID STRUCTURE, AND MICROCHANNEL DEVICE

(71) Applicants: ASAHI KASEI KABUSHIKI KAISHA, Tokyo (JP); NATIONAL INSTITUTE OF ADVANCED INDUSTRIAL SCIENCE AND TECHNOLOGY, Tokyo (JP)

(72) Inventors: Yuzo Kotani, Tokyo (JP); Ryo Iino, Tokyo (JP); Kanako Mizumura, Tokyo (JP); Hidenori Nagai, Ikeda (JP); Shunsuke Furutani, Ikeda (JP)

(73) Assignees: ASAHI KASEI KABUSHIKI KAISHA, Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 425 days.

(21) Appl. No.: 18/702,256

(22) PCT Filed: Oct. 18, 2022

(86) PCT No.: PCT/JP2022/038789

§ 371 (c)(1),
(2) Date: Apr. 17, 2024

(87) PCT Pub. No.: WO2023/068276

PCT Pub. Date: Apr. 27, 2023

(65) Prior Publication Data

US 2024/0408595 A1 Dec. 12, 2024

(30) Foreign Application Priority Data

Oct. 18, 2021 (JP) ................................ 2021-170472

(51) Int. Cl.
*B01L 3/00* (2006.01)
*B32B 3/30* (2006.01)
(Continued)

(52) U.S. Cl.
CPC ... *B01L 3/502715* (2013.01); *B01L 3/502707* (2013.01); *B32B 3/30* (2013.01);
(Continued)

(58) Field of Classification Search
CPC ......... B01L 2200/12; B01L 2300/0645; B01L 2300/168; B01L 3/502707;
(Continued)

(56) References Cited

U.S. PATENT DOCUMENTS

2002/0058332 A1 5/2002 Quake et al.
2011/0053799 A1 3/2011 Abiko et al.
(Continued)

FOREIGN PATENT DOCUMENTS

JP 4442335 B2 3/2010
JP 2010-70614 A 4/2010
(Continued)

OTHER PUBLICATIONS

International Preliminary Report on Patentability and Written Opinion of the International Searching Authority for International Application No. PCT/JP2022/038789, dated Apr. 23, 2024, with an English translation.
(Continued)

*Primary Examiner* — Jennifer Wecker
*Assistant Examiner* — Jonathan Bortoli
(74) *Attorney, Agent, or Firm* — Birch, Stewart, Kolasch & Birch, LLP

(57) ABSTRACT

A structure 10 comprising microchannels 14, wherein:
the structure 10 includes a base material 11, a partition material 12 and a cover material 13,
(Continued)

at least portions of the base material 11 and partition material 12 have a resin region obtained from an alkali-soluble resin 21,
in the infrared absorption spectrum by infrared spectroscopy of the resin region 21, the ratio (Aa/Ac) between:
the maximum peak intensity (Aa) in a first range of 1555 to 1575 $cm^{-1}$ and
the maximum peak intensity (Ac) in a second range of 1715 to 1735 $cm^{-1}$
is greater than 0 and 0.200 or lower, and
the water contact angle on the flow channel-forming surface 11*a* of the base material 11 is 40 to 150 degrees.

20 Claims, 3 Drawing Sheets

(51) Int. Cl.

| | |
|---|---|
| ***B32B 17/10*** | (2006.01) |
| ***B32B 27/08*** | (2006.01) |
| ***B32B 27/30*** | (2006.01) |
| ***B32B 37/24*** | (2006.01) |
| ***B32B 38/00*** | (2006.01) |
| ***B32B 38/10*** | (2006.01) |
| ***G03F 7/16*** | (2006.01) |
| ***G03F 7/20*** | (2006.01) |
| ***G03F 7/40*** | (2006.01) |

(52) U.S. Cl.
CPC .............. *B32B 17/10* (2013.01); *B32B 27/08* (2013.01); *B32B 27/302* (2013.01); *B32B 27/308* (2013.01); *B32B 37/24* (2013.01); *B32B 38/0008* (2013.01); *B32B 38/10* (2013.01); *G03F 7/161* (2013.01); *G03F 7/2051* (2013.01); *G03F 7/40* (2013.01); *B01L 2200/12* (2013.01); *B01L 2300/0645* (2013.01); *B01L 2300/168* (2013.01); *B32B 2037/243* (2013.01); *B32B 2315/08* (2013.01); *B32B 2325/00* (2013.01); *B32B 2333/12* (2013.01)

(58) Field of Classification Search
CPC ....... B01L 3/502715; B01L 2300/0887; B32B 17/10; B32B 2037/243; B32B 2315/08; B32B 2325/00; B32B 2333/12; B32B 27/08; B32B 27/302; B32B 27/308; B32B 3/30; B32B 37/24; B32B 38/0008; B32B 38/10; G03F 7/161; G03F 7/2051; G03F 7/40; G03F 7/004; G03F 7/027; G03F 7/033; G03F 7/039; B81B 1/00; B81C 1/00; G01N 37/00
See application file for complete search history.

(56) References Cited

U.S. PATENT DOCUMENTS

| | | | | |
|---|---|---|---|---|
| 2016/0136638 | A1 | 5/2016 | Hieda et al. | |
| 2017/0354971 | A1* | 12/2017 | Taniguchi | B01F 33/30 |
| 2018/0085756 | A1 | 3/2018 | Kosaka et al. | |
| 2020/0393754 | A1 | 12/2020 | Nagai et al. | |

FOREIGN PATENT DOCUMENTS

| | | | |
|---|---|---|---|
| JP | 2011-46853 | A | 3/2011 |
| JP | 2011-137636 | A | 7/2011 |
| JP | 2011-169828 | A | 9/2011 |
| JP | 2011-191287 | A | 9/2011 |
| JP | 2018-51685 | A | 4/2018 |
| JP | 2020-204769 | A | 12/2020 |
| TW | 201042373 | A1 | 12/2010 |
| TW | 202120450 | A | 6/2021 |
| WO | WO 2015/012212 | A1 | 1/2015 |

OTHER PUBLICATIONS

International Search Report for International Application No. PCT/JP2022/038789, dated Nov. 29, 2022, with an English translation.
Taiwanese Office Action and Search Report for Taiwanese Application No. 111139524, dated Sep. 6, 2023.

* cited by examiner

STRUCTURE COMPRISING MICROCHANNEL, PRODUCTION METHOD FOR SAID STRUCTURE, AND MICROCHANNEL DEVICE

FIELD

The present invention relates to a structure comprising microchannels, to a process for its production, and to a microfluidic device.

BACKGROUND

Interest in microfluidic devices has been increasing in the prior art from the viewpoint of providing telemedicine and point of care testing (POCT). The term "microfluidic devices" is a term that includes and may refer to microflow devices, microflow chips, μTAS (Micro Total Analysis Systems), LOC (Lab on a Chip) or micro reactors.

A microfluidic device has a structure with microchannels (hereunder also simply referred to its "structure"). Such microchannel structures have commonly been formed by injection molding, mold forming or glass etching. Methods are also known for forming microchannels using photosensitive resin compositions. PTL 1, for example, discloses a method in which a photosensitive resin composition is cast into a die and solidified by photopolymerization, creating a fine pattern.

Methods are also known for creating microchannels using photosensitive resin laminates (also referred to as "dry films"). For example, PTL 2 discloses a method of using an alkali developing solution for development (dissolution or removal) of the unexposed sections (uncured sections) of a resin that is alkali-soluble due to the presence of carboxyl groups, to form a fine pattern. PTL 3 discloses a method in which a pattern-forming material is cured in two stages to form microchannels, with a view toward preventing adhesion of the base material in the fluid channels onto the fluid channel wall surfaces.

CITATION LIST

Patent Literature

[PTL 1] Japanese Unexamined Patent Publication No. 2011-46853

[PTL 2] Japanese Unexamined Patent Publication No. 2010-70614

[PTL 3] International Patent Publication No. WO2015/012212

SUMMARY

Technical Problem

With the method of PTL 1, however, a die matching the flow channel pattern is required for casting of the photosensitive resin composition, and this has been disadvantageous in comparison to methods using dry films, from the viewpoint of fabricating different types of fine patterns.

With methods using dry films, formation of carboxylates and other residues in the resulting patterns can potentially occur, since they employ alkali developing solutions. PTL 2 mentions nothing in this regard, and therefore with the method of PTL 2, due to the hydrophilic action of carboxylates, the fluid in the microchannels moves in unexpected ways, meaning that it is difficult to control movement of fluid in the microchannels.

In recent years, as demand has increased for greater precision of output results from microfluidic devices (such as the synthesis results or test results obtained from them), other methods have been developed which allow improved properties to be obtained for microfluidic devices, using different approaches than preventing adhesion of base material to flow channel side walls, such as described in PTL 3.

The problem to be solved by the invention is therefore that of providing a structure comprising microchannels, which can reduce unintended movement of fluid that may occur by capillary action in microchannels created using a dry film, thereby allowing more favorable control of fluid movement, and that can thus improve the precision of output results from microfluidic devices. Another problem to be solved by the invention is that of providing a production method for the aforementioned structure, and a microfluidic device comprising the structure.

Solution to Problem

The present inventors have found that the aforementioned object can be achieved by the following technical means, and an embodiment of the invention has thereupon been completed. The embodiment of the invention is as follows.

[1]

A structure comprising microchannels, wherein:

the structure includes a base material, a partition material and a cover material, at least portions of the base material and partition material have a resin region obtained from an alkali-soluble resin, in the infrared absorption spectrum by infrared spectroscopy of the resin region, the ratio (Aa/Ac) between:

the maximum peak intensity (Aa) in a first range of 1555 to 1575 $cm^{-1}$ and the maximum peak intensity (Ac) in a second range of 1715 to 1735 $cm^{-1}$ is greater than 0 and 0.200 or lower, and the water contact angle on the flow channel-forming surface of the base material is 40 to 150 degrees.

[2]

The structure comprising microchannels according to [1] above, wherein the ratio (Aa/Ac) is 0.100 or lower.

[3]

The structure comprising microchannels according to [1] or [2] above, wherein the ratio (Aa/Ac) is 0.085 or lower.

[4]

The structure comprising microchannels according to any one of [1] to [3] above, wherein the ratio (Aa/Ac) is 0.050 or lower.

[5]

The structure comprising microchannels according to any one of [1] to [4] above, wherein the first range includes absorption intensity corresponding to stretching vibration of carbonyl (C═O) bonds in carboxylates.

[6]

The structure comprising microchannels according to any one of [1] to [5] above, wherein the second range includes absorption intensity corresponding to stretching vibration of carbonyl (C═O) bonds due to esters.

[7]

The structure comprising microchannels according to any one of [1] to [6] above, wherein the ratio (Ad/Ac) between the maximum peak intensity (Ad) in a third range of 1625 to 1645 $cm^{-1}$ and the maximum peak intensity (Ac) is greater than 0 and 0.150 or lower.

[8]

The structure comprising microchannels according to [7] above, wherein the third range includes absorption intensity corresponding to stretching vibration of carbon-carbon (C=C) bonds occurring with carbon-carbon double bonds.

[9]

The structure comprising microchannels according to any one of [1] to [8] above, wherein the resin region essentially lacks components derived from alkali metal salts.

[10]

The structure comprising microchannels according to any one of [1] to [9] above, wherein the water contact angle is 60 to 130 degrees.

[11]

The structure comprising microchannels according to any one of [1] to [10] above, wherein the resin region is derived from a resin that includes a (meth)acrylic resin.

[12]

The structure comprising microchannels according to any one of [1] to [11] above, wherein the resin region is derived from a resin composed of a photosensitive resin composition comprising the following components:

(a) an alkali-soluble polymer comprising a carboxyl group;

(b) an addition polymerizable monomer; and (c) a photopolymerization initiator or its decomposition product.

[13]

The structure comprising microchannels according to any one of [1] to [12] above, wherein the partition material includes the resin region.

[14]

The structure comprising microchannels according to any one of [1] to [13] above, wherein the resin region has a P (1/μm) value of 1650 or lower, as represented by the following formula (1):

$$P = \left[(1/h)\cdot\cos\{(\theta s/180)\cdot\pi\} + (1/h)\cdot\cos\{(\theta b/180)\cdot\pi\} + (2/w)\cdot\cos\{(\theta/180)\cdot\pi\}\right]\cdot 106 \quad (1)$$

{where:

θs: water contact angle on the flow channel-forming surface of the cover material (deg).

θb: water contact angle on the flow channel-forming surface of the base material (deg), θ: water contact angle on the flow channel-forming surface of the partition material (deg), h: length of the flow channel-forming surface of the partition material when the structure is cut along the thickness direction (μm), w: length of the flow channel-forming surface of the base material when the structure is cut along the thickness direction (μm)}.

[15]

A process for producing a structure comprising microchannels, comprising:

(i-1) a step of coating a photosensitive resin composition solution containing a solvent with a boiling point of below 100 °C onto a support and drying it to form a photosensitive resin layer containing an alkali-soluble resin on the support.

(i-2) a step of laminating the photosensitive resin layer onto a base material, (ii) a step of developing the laminated photosensitive resin layer with an aqueous organic base solution to form a flow channel pattern, and (iii) a step of surface-treating the flow channel pattern by heat treatment of the flow channel pattern, thereby forming a resin region obtained from the alkali-soluble resin, wherein in the infrared absorption spectrum by infrared spectroscopy of the resin region, the ratio (Aa/Ac) of the maximum peak intensity (Aa) in a first range of 1555 to 1575 $cm^{-1}$ and the maximum peak intensity (Ac) in a second range of 1715 to 1735 $cm^{-1}$, is greater than 0 and 0.200 or lower.

[16]

The process for producing a structure comprising microchannels according to [15] above, wherein step (ii) has a step of exposing the photosensitive resin layer before development.

[17]

The process for producing a structure comprising microchannels according to above, wherein direct imaging exposure without a mask is carried out during the exposure step in step (ii).

[18]

The process for producing a structure comprising microchannels according to any one of [15] to [17] above, which has (iv) a step of forming a cover material by lamination, after step (iii).

[19]

A microfluidic device equipped with the structure comprising microchannels according to any one of [1] to [14] above.

[20]

The microfluidic device according to [19] above, which comprises:

a base material with electrodes, an electrode protective layer, provided on the base material, and the structure comprising microchannels layered on the base material and/or on the electrode protective layer.

Advantageous Effects of Invention

According to the invention it is possible to provide a structure comprising microchannels, which can reduce unintended movement of fluid that may occur by capillary action in microchannels created using a dry film, thereby allowing more favorable control of fluid movement, and that can thus improve the precision of output results from microfluidic devices. It is also possible according to the invention to provide a production method for the aforementioned structure, and a microfluidic device comprising the structure.

DESCRIPTION OF EMBODIMENTS

Figure 1A:
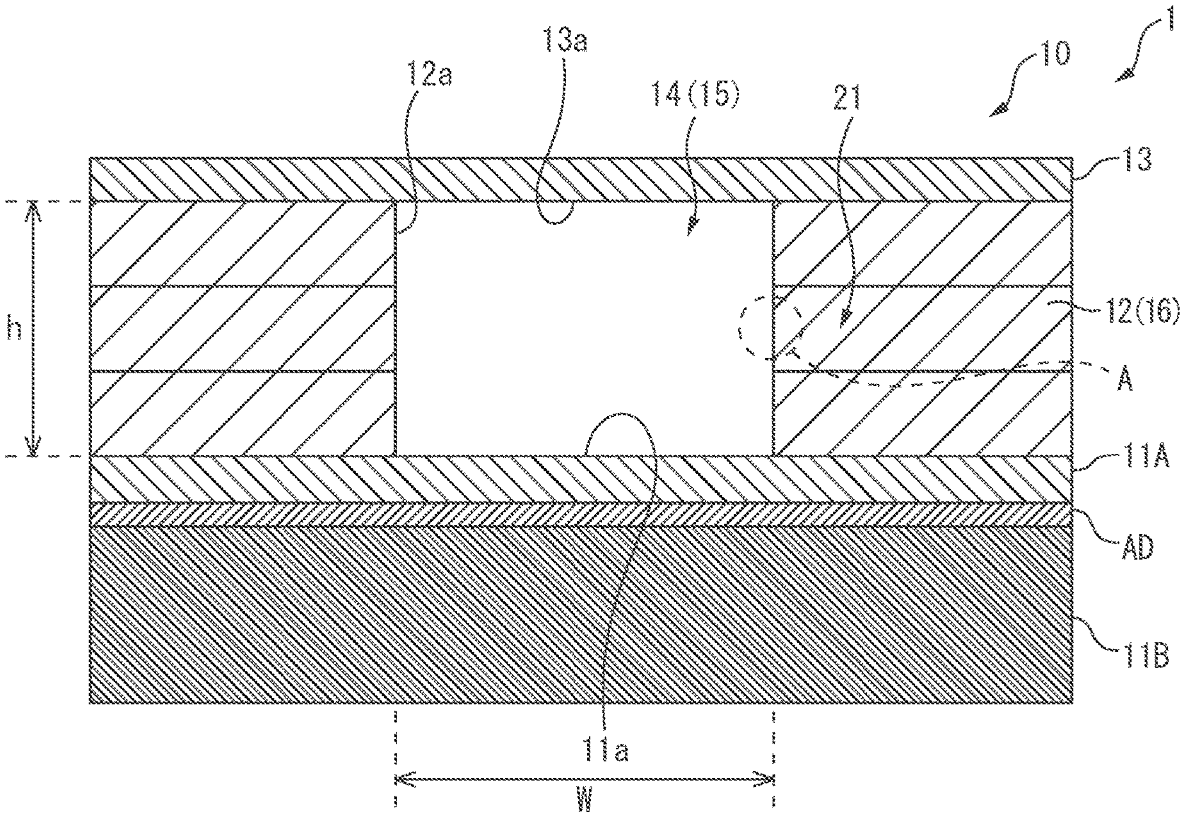
FIG. 1 is a cross-sectional view and plan view illustrating an example of a structure according to the embodiment.
Figure 1B:
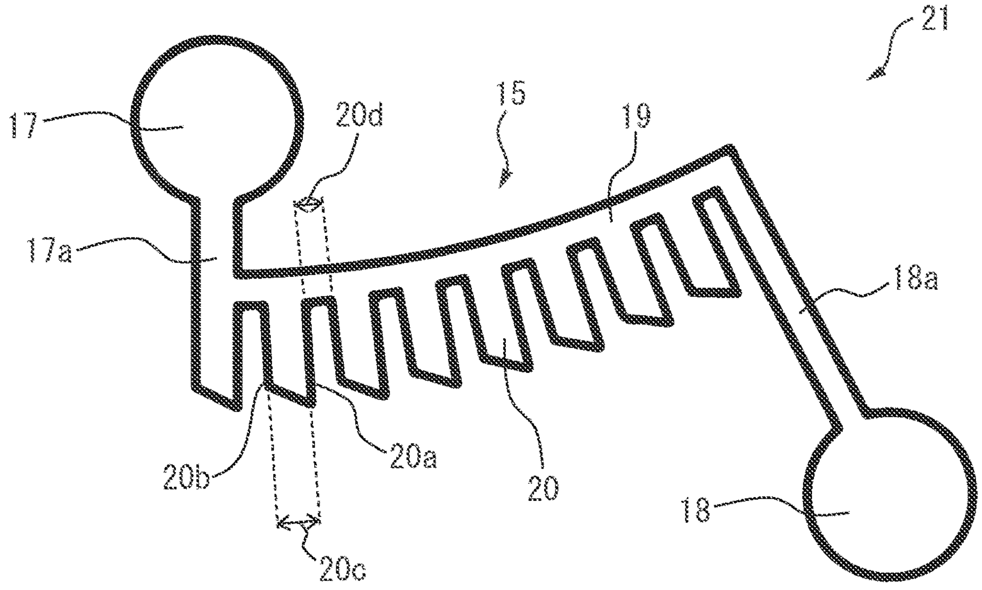
Figure 2A:
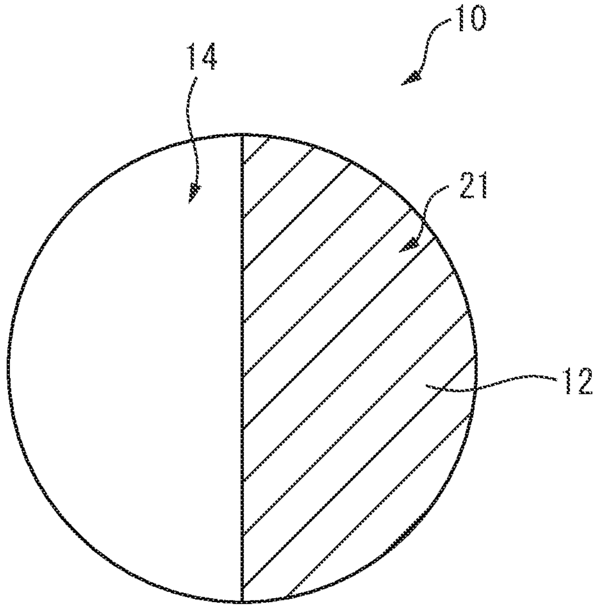
FIG. 2 is a pair of magnified cross-sectional views showing two different examples of a structure according to the embodiment.
Figure 2B:
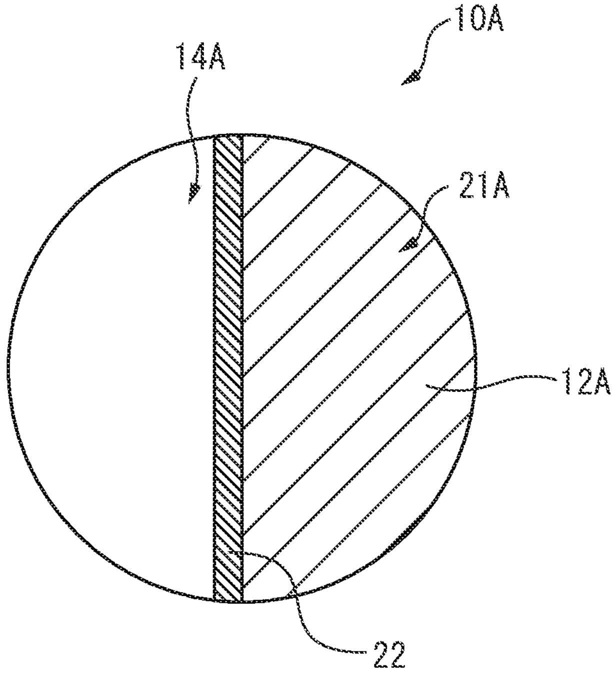

The structure comprising microchannels of the embodiment will now be described with reference to the accompanying drawings. Numerical ranges indicated herein with the preposition "to" represent numerical ranges that include the bounding upper and lower limits. Where numerical ranges are referred to herein in stepwise manner, any upper limit or lower limit specifying a numerical range may replace the upper limit or lower limit of any other stepwise numerical range. The upper limit or lower limit of a numerical range may also replace any value mentioned in the Examples. The term "step", as used herein, refers not only to an independent step, but also includes any function added to a step, even if it cannot be clearly distinguished from another step. The scales, forms and lengths shown in FIG. 1 and FIG. 2 are exaggerated for clarity.

[Microfluidic Device]

<Structure Comprising Microchannels>

(General structure)

FIG. 1(*a*) is a cross-sectional view showing a configuration example of a structure 10, and FIG. 1(*b*) is a plan view showing a configuration example of the structure 10.

As shown in FIG. 1(*a*), the microfluidic device 1 comprises the structure 10. The structure 10 has a base material 11, a partition material 12 provided on the base material 11, and a cover material 13 provided on the partition material 12, whereby microchannels 14 are formed as channels for fluid (liquid or gas). The partition material 12 is constructed to include a resin layer 16 on which a flow channel pattern 15 is formed. The partition material 12 is shown to have a three-layer structure in the drawings, but it may also have a monolayer structure or a different multilayer structure (such as a 4-layer structure. 5-layer structure, 6-layer structure, 7-layer structure or 8-layer structure).

(Partition Material)

As shown in FIG. 1(*b*), the flow channel pattern 15 is constructed with an injection port 17, an injection port pattern 17*a* leading out from the injection port 17, a waste liquid port 18, a waste liquid port pattern 18*a* leading out from the waste liquid port 18, a main flow channel pattern 19 connecting the injection port pattern 17*a* and waste liquid port pattern 18*a*, and a plurality of weighing flow channel patterns 20, extending in a comb-like manner from the main flow channel pattern 19. Each of the weighing flow channel patterns 20 has a long side 20*a*, a short side 20*b*, a flow channel pattern width 20*c* and a partition width 20*d*.

According to the embodiment, the flow channel pattern 15 is constructed as a microchannel pattern 15 for weighing purposes, but the shown construction is merely an example. The construction of the flow channel pattern may incorporate various modifications depending on the use and overall structure of the microfluidic device.

The flow channel pattern 15 can be fabricated using a dry film. For example, in FIG. 1(*b*) the region within the frame of the flow channel pattern 15 is the unexposed section, and the region outside of the frame is the exposed section. Exposure of the region outside the frame of the flow channel pattern 15 produces curing, and then development of the region inside the frame with an alkali developing solution produces the flow channel pattern 15. A method using a dry film is advantageous in fabricating various different types of fine patterns, and in that it allows favorable selection of the exposure conditions and/or development conditions according to the desired flow channel pattern. The dry film may also be a dry film resist.

As mentioned above, this example is of a method using a "negative-type" dry film that allows the unexposed sections to be removed by development, but according to the invention a method using a "positive-type" dry film may also be used.

One or more microfluidic devices 1 may disposed, with one or more disposed on a silicon wafer (not shown), the injection port 17 being disposed at the center and the waste liquid port 18 being disposed in the circumferential direction of the silicon wafer, for example.

The method for causing movement of the fluid in the microchannels 14 (including not only movement of the fluid in different patterns but also introduction of fluid through the injection port 17 and discharge of fluid from the waste liquid port 18) may be a method utilizing a micropump (not shown) or a method utilizing centrifugal force, for example. Regardless of the method of fluid conveyance, capillary action causes energy to act on the fluid so that it moves through the microchannels 14. This reduces unwanted movement of fluid that can be induced by capillary action in the microchannels 14, thereby aiding favorable control of fluid movement and improving the precision of output results from the microfluidic device 1.

(Resin Region)

FIG. 2(*a*) is a magnified cross-sectional view of a configuration example in region A of FIG. 1(*a*). As shown in FIG. 2(*a*), the structural member of the microchannel 14 (the partition material 12 according to this embodiment) at least partially has a resin region 21. The resin region 21 is formed of an alkali-soluble resin.

In the infrared absorption spectrum by infrared spectroscopy of the resin region 21, the ratio (Aa/Ac) between:

the maximum peak intensity (Aa) in a first range of 1555 to 1575 $cm^{-1}$ and the maximum peak intensity (Ac) in a second range of 1715 to 1735 $cm^{-1}$, is greater than 0 and 0.200 or lower.

The "maximum peak intensity" is the maximum of the obtained peak intensities.

The present inventors focused on the fact that a composition in which the main functional group absorbs energy in the first range has higher hydrophilicity than a composition in which the main functional group absorbs energy in the second range. Considering that in the resin region 21 it is the maximum peak intensity (Ac) in the second range that plays the role of the internal standard for defining the ratio of the maximum peak intensity (Aa) in the first range, it can be understood that "the hydrophilicity is higher in the structural region with large energy absorption in the first range". If the ratio (Aa/Ac) is 0.200 or lower, therefore, it is possible to reduce the degree of hydrophilicity of the structural member of the microchannel 14 (the partition material 12, for this embodiment), and to thereby reduce unwanted movement of fluid induced by capillary action.

Among the major functional groups exhibiting energy absorption in the first range, some are functional groups with the role of imparting alkali solubility. A ratio (Aa/Ac) exceeding 0, therefore, satisfies the prerequisite conditions for fabrication of the flow channel pattern 15 using a dry film.

As mentioned above, if the ratio (Aa/Ac) is controlled to within a relatively small range it becomes possible to form the flow channel pattern 15 by development using an alkali developing solution, to reduce the degree of hydrophilicity of the structural member of the microchannel 14 (partition material 12, according to the embodiment). By reducing the degree of hydrophilicity it is possible to reduce unwanted movement of fluid induced by capillary action within the microchannel 14.

The first range includes absorption intensity corresponding to stretching vibration of carbonyl (C═O) bonds in carboxylates, for example. Carboxylates have high hydrophilic action, and thus tend to reduce capillary action-induced unwanted movement of fluid at relatively lower amounts.

The second range includes absorption intensity corresponding to stretching vibration of ester-derived carbonyl (C═O) bonds, for example. Esters have lower hydrophilic action than carboxylates, and thus tend to more easily reduce capillary action-induced unwanted movement of fluid at relatively greater amounts.

Since the first range and second range include the aforementioned respective absorption intensities, it is easy to synergistically reduce unwanted movement of fluid induced by capillary action.

The following is a description of the relationship between the major functional group where energy absorption is observed in the first range, the major functional group where energy absorption is observed in the second range, and the method of creating microchannels using a dry film.

An alkali developing solution is used to develop the uncured sections of an alkali-soluble resin layer. Using an alkali developing solution can potentially generate or leave residue of carboxylates in the resulting pattern. The first range includes absorption intensity corresponding to stretching vibration of carbonyl (C═O) bonds due to such carboxylates.

When the uncured sections are developed with an alkali developing solution, favorable development process conditions are selected and the flow channel pattern obtained by development is heat treated to allow conversion of the carboxylates to carboxylic acids or carboxylic acid esters. The absorption intensity corresponding to stretching vibration of the carboxylic acid ester carbonyl (C═O) bonds is included in the aforementioned second range.

Because an alkali developing solution is used during creation of the flow channel pattern using a dry film in this manner, the resulting pattern is expected to have generation or residue of carboxylates which are associated with the first range. Subsequent heat treatment, however, can convert the carboxylates to carboxylic acid esters which are associated with the second range. In other words, the structural member of the microchannel 14 (partition material 12, according to this embodiment) can be surface treated, in a manner of speaking, to modify the structural member, in order to obtain a resin region 21 satisfying ratio (Aa/Ac). Undesirable movement of fluid due to capillary action can thereby be reduced.

The maximum peak intensity (Aa) and maximum peak intensity (Ac) can be adjusted by appropriately modifying the starting material composition and fabrication method for the structural member of the microchannel 14 (partition material 12, according to the embodiment), which has a resin region 21. The fabrication method can be modified by appropriately changing the type of alkali developing solution and the exposure and development conditions, as well as the subsequent heating conditions. After development, the maximum peak intensity (Aa) may be increased and the maximum peak intensity (Ac) may be lowered, based on conditions that favor generation and residue of carboxylates in the obtained pattern. Conversely, the maximum peak intensity (Aa) may be lowered and the maximum peak intensity (Ac) may be increased, based on conditions that favor conversion of carboxylates to carboxylic acids or carboxylic acid esters.

From the viewpoint of more reliably obtaining the effect of the embodiment as described above, the ratio (Aa/Ac) is preferably 0.100 or lower, more preferably 0.085 or lower and even more preferably 0.050 or lower.

Preferably, the ratio (Ad/Ac) of the resin region 21 between:

the maximum peak intensity (Ad) in a third range of 1625 to 1645 $cm^{-1}$ and the maximum peak intensity (Ac)

is greater than 0 and 0.150 or lower.

Functional groups with photopolymerizable double bonds are also included among the main functional groups where energy absorption is observed in the third range. These will often be found in the structural member of the microchannel 14 (partition material 12, according to the embodiment). Therefore if the ratio (Ad/Ac) using the maximum peak intensity (Ad) in the third range is adjusted to a relatively small range, this implies that the maximum peak intensity (Ac) is controlled to a relatively large range. It also implies that the ratio (Aa/Ac) is controlled to a relatively small range. Since low absorption by photopolymerizable double bonds indicates a corresponding degree of crosslinking, this is preferred from the viewpoint of inhibiting loss of material from the partition materials. Satisfying this range for the ratio (Ad/Ac) can therefore help reduce unwanted movement of fluid induced by capillary action.

The third range includes absorption intensity corresponding to stretching vibration of carbon-carbon (C═C) bonds, which occurs with carbon-carbon double bonds. Such bonds will often be found in the structural member of the microchannel 14 (partition material 12, according to the embodiment). Undesirable movement of fluid due to capillary action can thereby be more easily reduced.

The resin region 21 is substantially free of alkali metal salt-derived components. This also helps reduce undesirable movement of fluid due to capillary action. Alkali metal salts include those deriving from aqueous organic base solutions, and specifically those deriving from alkali developing solutions, such as sodium.

The resin region 21 is preferably derived from a resin that includes a (meth)acrylic resin. Employing a method of creating a flow channel pattern 15 using a dry film facilitates formation of the resin region 21 in the structural member of the microchannel 14 (partition material 12, according to the embodiment). From this viewpoint, the resin region 21 is preferably derived from a resin composed of a photosensitive resin composition comprising the following components:

(a) an alkali-soluble polymer;

(b) an addition polymerizable monomer; and (c) a photopolymerization initiator or its decomposition product (hereunder referred to simply as "photopolymerization initiator").

The structural member of the microchannel 14 (partition material 12, according to the embodiment) at least partially has a resin region 21. When the structural member has a region that is not the resin region 21 (another region, which is not shown), the boundaries between the resin region 21 and the other region in the structural member do not need to be distinct. If the process for forming the resin region 21 is applied only at specific locations of the structural member, the resin region 21 is highly likely to be formed at those specific locations or associated locations. The process for forming the resin region 21 may also be applied essentially across the entire structural member, in which case the resin region 21 will be formed essentially over the entire structural member. In this case if the resin region 21 is confirmed to be formed in one certain specific location of the structural member, then the probability is high that the resin region 21 will also be formed in the other locations.

When the process for forming the resin region 21 is basically applied across the entire structural member, rather than avoiding application at specific locations of the structural member, this corresponds to "essentially over the entire structural member".

FIG. 2(*b*) is a magnified cross-sectional view of another configuration example in region A of FIG. 1(*a*).

In the structure 10A according to another configuration example, as shown in FIG. 2(*b*), at least a portion of the region of the structural member of the microchannel 14A (the partition material 12A, according to the embodiment) which is exposed in the flow channel is covered with a coating layer 22 that is not part of the resin region 21A. The coating layer 22 is a fluorine coating layer, for example.

The resin region 21A does not need to be exposed on the flow channel inner wall so long as the effect of the embodiment is obtained. If the effect of the embodiment can be obtained, then most of the region exposed inside the flow channel (at least 50%, at least 80%, at least 90% or at least 95% of the total exposed area) may be covered by the coating layer 22 that is not part of the resin region 21A.

The resin region 21 preferably has a P (1/μm) value of 1650 or lower, as represented by the following formula (1):

$$P = \left[(1/h)\cdot\cos\{(\theta s/180)\cdot\pi\} + (1/h)\cdot\cos\{(\theta b/180)\cdot\pi\} + (2/w)\cdot\cos\{(\theta/180)\cdot\pi\}\right]\cdot 106 \quad (1)$$

{where:

θs: water contact angle on the flow channel-forming surface 13*a* of the cover material 13 (deg), θb: water contact angle on the flow channel-forming surface 11*a* of the base material 11 (deg), θ: water contact angle on the flow channel-forming surface 12*a* of the partition material 12 (deg).

h: length of the flow channel-forming surface 12*a* of the partition material 12 when the structure 10 is cut along the thickness direction (μm), w: length of the flow channel-forming surface 11*a* of the base material 11 when the structure 10 is cut along the thickness direction (μm)}.

In this case, interfacial tension between the base material 11, partition material 12 and cover material 13 forming the flow channel-forming surface can be controlled within a predetermined range to further improve the stability of fluid conveyance, thereby helping to reduce unwanted movement of fluid caused by capillary action.

Figure 3:
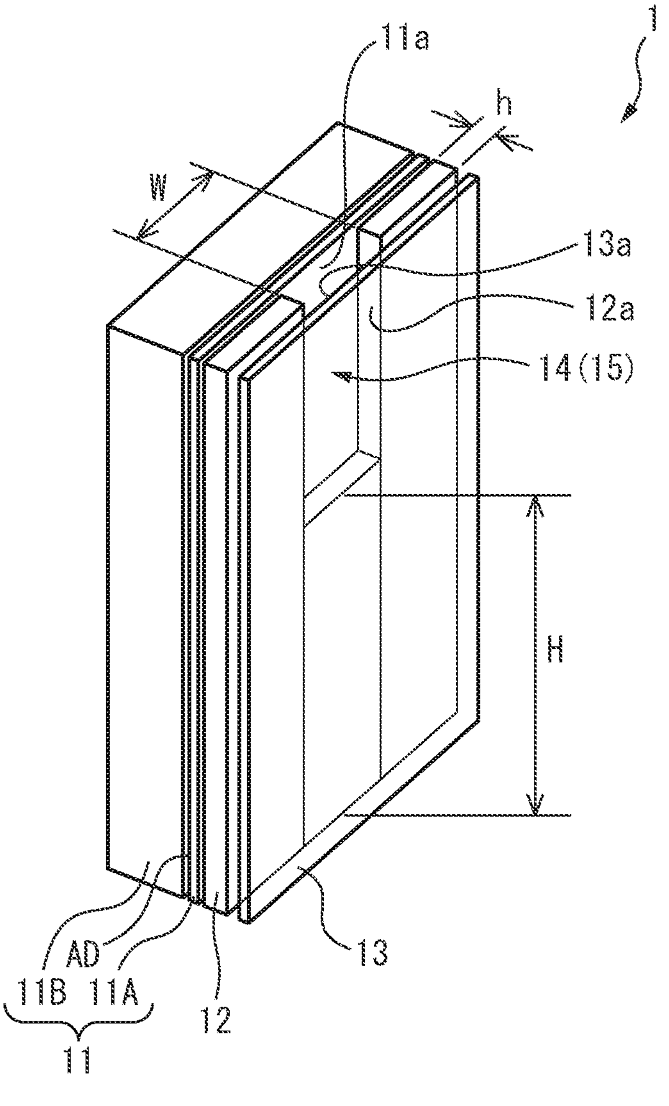
FIG. 3 is a diagram illustrating an example of a structure according to the embodiment.

FIG. 3 is a diagram illustrating an example of the structure 10, which will be referred to in explaining the significance of the above-mentioned formula.

Capillary action in a microchannel is affected by interfacial tension (at room temperature, for example) at the flow channel-forming surface.

It is also affected by the interfacial tension (N) of the flow channel-forming surface 13*a* at the cover material 13, as $(T\cdot 10^{-6})\cdot w\cdot\cos\{(\theta s/180)\cdot\pi\}$;

interfacial tension (N) of the flow channel-forming surface 11*a* at the base material 11, as $(T\cdot 10^{-6})\cdot w\cdot\cos\{(\theta b/180)\cdot\pi\}$; and interfacial tension (N) of the flow channel-forming surface 12*a* at the partition material 12, as $(T\cdot 10^{-6})\cdot 2h\cdot\cos\{(\theta/180)\cdot\pi\}$ (where the construction is assumed to have two flow channel-forming surfaces 12*a* with their partition materials 12 facing each other, and T is defined as water surface tension (N/m)).

The mass of fluid in a microchannel is related to:

the length h of the flow channel-forming surface 12*a* at the partition material 12, when the structure 10 is cut along the thickness direction (μm);

the length w of the flow channel-forming surface 11*a* at the base material 11, when the structure 10 is cut along the thickness direction (μm); and the product hwHμg of the length H of the flow channel (μm): the density ρ of the fluid ($Kg/m^3$); and the gravity g ($m/s^2$).

Using the surface tension T of water (N/m), the following relationship applies:

$$hwH\rho g\cdot 10^{-18} = T\cdot\left[w\cdot\cos\{(\theta s/180)\cdot\pi\} + w\cdot\cos\{(\theta b/180)\cdot\pi\} + 2h\cdot\cos\{(\theta/180)\cdot\pi\}\right]\cdot 10^{-6}$$

based on the interfacial tension at the flow channel-forming surface and the mass of the fluid inside the microchannel.

The present inventors have found that these factors affecting capillary action can be treated as a function of the water contact angle of the flow channel-forming surface and the size of the microchannel.

By moving h and w which are related to the microchannel size-related variables h and w, and $10^{-12}$, to the right side of the formula and moving T to the left side, the following formula:

$$(H\rho g/T)\cdot 10^{-6} = \left[(1/h)\cdot\cos\{(\theta s/180)\cdot\pi\} + (1/h)\cdot\cos\{(\theta b/180)\cdot\pi\} + (2/w)\cdot\cos\{(\theta/180)\cdot\pi\}\right]\cdot 10^{6}$$

is derived. As seen on the left and right sides, the expression represents a function of the water contact angle of the flow channel-forming surface and the size of the microchannel. The right side corresponds to (1) above. The left side is expressed as $(H\mu g/T)\cdot 10^{-6}$.

Interfacial tension between the flow channel-forming surface and water can be derived from the water contact angle of the flow channel-forming surface, with the effects of their changes on P being as described above. Liquid conveyance tends to be impeded with a smaller flow channel size (flow channel cross-sectional area). The value of P can be controlled to ≤1650 by appropriately adjusting the microchannel construction and constituent materials using these factors as indicators. While the value of P can theoretically be a negative value, it is preferably 0 or greater.

The numerical value of "1650" for the magnitude relationship with P is the value calculated as $(H\mu g/T)\cdot 10^{-6}$ on the left side of the formula, in consideration of the construction and use assumed for the structure of the embodiment, and the type of fluid, as a value that tends to reduce unwanted movement of fluid caused by capillary action. Since total capillary action on the four sides forming the flow channel is within a predetermined range, the value that is able to stop the aqueous solution in the flow channel in the absence of driving force for liquid conveyance corresponds to the aforementioned numerical value of "1650".

The resin region 21 described above is provided in at least a portion of the structural member of the microchannel 14. While a partition material 12 was assumed in explaining the structural member provided with the resin region 21 for this embodiment, the resin region 21 may also be provided in the base material 11. That is, the resin region 21 may be:

provided in the base material 11.

provided in the partition material 12 or provided in both the base material 11 and partition material 12.

(Remaining Construction)

The base material 11 may be composed of any translucent material or non-translucent material, but preferably it is formed of a translucent material such as a resin or glass, and more preferably it is formed of a resin. The term "translucent" is here used in the wide sense of allowing light to pass through, without regard to being colored or colorless, or to the amount of light transmittance.

The base material 11 may have a multilayer structure, in which case it may have multiple layers made of a translucent material, or multiple layers made of a non-translucent material, or layers made of a translucent material and layers made of a non-translucent material. The number of layers of the base material 11 is not limited, and as an example. FIG. 1(*a*) shows a base material 11 with a multilayer structure having a first layer 11A with an adhesive layer AD, and an second layer 11B, in that order from the inner side of the flow channel. The layer forming the flow channel-forming surface 11*a* of the base material 11 is preferably made of a material advantageous for stability of fluid conveyance, such as a translucent material, and especially a resin. The layer after the first layer 11A (the second layer 11B in FIG. 1(*a*)) is preferably made of a material that is advantageous for heat resistance, such as a translucent material, and especially glass. While the adhesive layer AD may be omitted, including an adhesive layer AD for the first layer 11A is preferred since the adhesive layer AD will provide satisfactory adhesion between the first layer 11A and second layer 11B.

The flow channel-forming surface 11*a* of the base material 11 (for example, the surface of the first layer 11A) has a water contact angle of 40 to 150 degrees. By controlling the degree of hydrophilicity in this manner it is possible to reduce unwanted movement of fluid caused by capillary action. The water contact angle is preferably 60 to 130 degrees, more preferably 80 to 120 degrees, and even more preferably 90 to 120 degrees. With a larger contact angle it is generally more desirable to prevent unwanted movement of fluid due to capillary action. According to the embodiment, unwanted movement of fluid caused by capillary action can be reduced under conditions in situations where it is particularly desired to prevent unwanted movement of fluid due to capillary action.

The water contact angle can be adjusted by the composition and fabrication conditions used to obtain the base material 11, and by the heat treatment conditions. Adjusting to a higher amount of hydrophilic components will tend to reduce the water contact angle, while adjusting to a lower amount of hydrophilic components will tend to increase the water contact angle. When the resin region 21 is provided in the base material 11, the region of the base material 11 where the water contact angle is within the aforementioned range may overlap with the resin region 21, or it may be different from the resin region 21.

The resin composing the base material 11 and/or adhesive layer AD may be an acrylic resin, polypropylene resin, polycarbonate resin, cycloolefin resin, polystyrene resin, polyester resin, urethane resin, vinyl chloride resin, silicone resin or fluorine-based resin, from the viewpoint of suitability for forming microchannels. The resin composing the base material 11 and/or adhesive layer AD may also be a resin which is suitable for use in the partition material 12.

A non-transparent material may be a silicon wafer or copper-clad laminate. When the state of fluid in the flow channel is to be detected by electric conductivity, an electrical circuit board with metal wiring, for example, may be used. The base material 11 may be smooth or may have concavoconvexities. Concavoconvexities may be, for example, fluid microchannels formed on the surface or metal wiring electrical circuits formed on the surface. The thickness of the base material 11 (the total thickness, if the base material 11 has a multilayer structure) is not particularly restricted but is preferably 10 μm to 10 mm.

The sizes of the microchannels 14 are selected according to the purpose, but they may have widths of 1 to 1000 μm or 10 to 70 μm and depths of 1 to 1000 μm or 5 to 750 μm, for example. According to one aspect, the flow channel-forming surfaces of the microchannels may all be flat or concavoconvex, and the angles between the bottoms and side walls or the side walls and coverings may be approximately right angles, but this is not limitative on the shapes of the microchannels, and the design may be according to the desired purpose.

The cover material 13 is preferably a material with resistance to fluids, and when the state of the fluid in the flow channels is to be detected by light, a highly light-transparent cover material 13 is used. The thickness of the cover material 13 may be 10 μm to 10 mm, for example, selected according to the purpose. The cover material 13 may be made of any of the aforementioned translucent materials or non-translucent materials, such as glass, in the case of a translucent material.

(Microfluidic Device Applying the Structure)

A microfluidic device 1 applying the structure 10 of the embodiment will now be described.

The microfluidic device 1 is a device comprising flow channels on the micro order size, examples of which include microfluidic devices such as POCT kits, ELISA (Enzyme-Linked ImmunoSorbent Assay) devices and micro reactors. The microfluidic device 1 comprises a base material 1, a partition material 12 formed by photolithography using a photosensitive resin laminate, and a cover material 13 situated covering the partition material 12.

In a compact disc (CD) ELISA device, a liquid tank storing a liquid, an analyzer that detects, reacts with, adsorbs, desorbs or decomposes the liquid, and microchannels connecting the liquid tank and the analyzer to allow flow of the liquid between them, are formed on a discoid base material, and the flow channel pattern is sealed with a cover material. In this case, the diameter of the base material is about 10 cm, the minimum flow channel width of the microchannels is about 45 μm, and the depth of the microchannels is about 300 μm. The number of analyzers on the base material may be 4 to 20 or 14 to 16, for example. The liquid is delivered outward from the center in the radial direction by centrifugal force of rotation of the base material, thus being supplied from the liquid tank to each analyzer via the microchannels.

Without being limited to the example described above. The microfluidic device applying the structure of the embodiment will typically comprise:

a base material with electrodes, an electrode protective layer for protection of the electrodes, provided on the base material, and a structure comprising microchannels layered on the base material and/or on the electrode protective layer.

The electrodes may be constructed of a conductive material, for example, and are electrically connected to a suitable control circuit or sensor mounted on the microfluidic device. The electrode protective layer may be constructed of any of various resin materials, for example. For example, a dry film may be used as the electrode protective layer.

[Photosensitive Resin Laminate]

The structure described above can be obtained using a photosensitive resin laminate of the embodiment.

Specifically, the embodiment provides a photosensitive resin laminate for a microfluidic device constructed of a support film and a photosensitive resin layer. The phrase "constructed of a support film and a photosensitive resin layer" means only that the laminate is essentially composed of a support film and a photosensitive resin layer, without excluding cases where other elements are included so long as the effect of the invention is not impeded. The photosensitive resin laminate for a microfluidic device according to the embodiment (hereunder also referred to simply as "photosensitive resin laminate") has properties particularly suited for formation of microchannels by photolithography, and it can be used as a base material for microchannels (the first layer 11A in FIG. 1(*a*), for example), a partition material or a cover material, for example.

According to a preferred aspect, the photosensitive resin layer is composed of a photosensitive resin composition having a ratio (I/O) of 1.0 or lower between the inorganic value (I) and the organic value (O)).

The ratio (I/O) between the inorganic value (I) and organic value (O), also known as the I/O value or inorganic/organic ratio, is a value expressing the polarity of a member or compound in an organic conceptual manner, as a method of assigning the contribution of functional groups by setting parameters for each functional group.

The (I/O) ratio is explained in detail in the relevant literature, including Yuki Kinenzu (Koda, Y., Sankyo Publishing (1984)); and Kumamoto Pharmaceutical Bulletin. No. 1. pp. 1-16 (1954) and Kagaku no Ryoiki Vol. 11. No. 10. pp. 719-725 (1957). The (I/O) ratio generally divides the properties of a member or compound into organic groups which represent covalent bondability and inorganic groups which represent ionic bondability, positioned on the coordinates of orthogonal axes which are respectively denoted as the organic axis and the inorganic axis.

The inorganic value (I) quantifies the effect of substituents or bonds in organic compounds on boiling point, based on hydroxyl groups. Specifically, since the distance between the boiling point curve for a straight-chain alcohol and the boiling point curve for a straight-chain paraffin, for approximately 5 carbon atoms, is about 100 °C, the effect of a single hydroxyl group is numerically defined as 100, and the values obtained by quantification of the effects of different substituents or different bonds on the boiling point, based on that numerical value, are used as the inorganic value (I) for the substituents of the organic compound. For example, the inorganic value (I) for a —COOH group is 150, while the inorganic value (I) for a double bond is 2. The inorganic value (I) for a given organic compound is therefore the sum of the inorganic values (I) for each of the substituents or bonds in the compound.

The organic value (O) is established using methylene groups in the molecule as units, based on the effect of carbon atoms (of methylene groups) on the boiling point. Specifically, since an average boiling point increase of 20 °C is produced by addition of one carbon atom to a straight-chain saturated hydrocarbon compound, assuming approximately 5 to 10 carbon atoms, on this criteria the organic value for one carbon atom is established as 20, and the numericalized value for the effect of each substituent or bond on the boiling point is the organic value (O). For example, the organic value (O) for nitro group ($-NO_2$) is 70.

Generally, an (I/O) ratio closer to 0 indicates a more non-polar organic material (high hydrophobicity and organicity), whereas a larger value indicates a more polar organic material (high hydrophilicity and inorganicity). From the viewpoint of resistance of the photosensitive resin laminate to fluid flowing through the microchannels (fluid resistance), the (I/O) ratio of the photosensitive resin layer is preferably 1.0 or lower, more preferably 0.9 or lower, even more preferably 0.8 or lower and most preferably 0.7 or lower. While the (I/O) ratio is preferably 0.0 from the viewpoint of fluid resistance, it may be 0.1 or greater, 0.2 or greater or 0.3 or greater from the viewpoint of facilitating production and developability of the photosensitive resin laminate. The (I/O) ratio is the value calculated based on the base resin and monomer of the photosensitive resin composition (excluding the photopolymerization initiator and additive).

The constituent elements of the photosensitive resin laminate for a microfluidic device of the embodiment will now be described.

<Photosensitive Resin Layer>

The photosensitive resin layer can be formed by application and drying of the photosensitive resin composition as a layer onto the support film. The photosensitive resin composition may include any polymer and/or monomer which can impart photosensitivity to the photosensitive resin laminate, and it may further include a photopolymerization initiator or other additives as desired.

From the viewpoint of formability of the member for a microfluidic device by photolithography, and the lamination property between the photosensitive resin laminate and the base material of the microfluidic device, the photosensitive resin composition preferably includes (a) an alkali-soluble polymer comprising a carboxyl group, (b) an addition polymerizable monomer and (c) a photopolymerization initiator. The photosensitive resin composition may also include an epoxy resin such as EPON™ SU-8 resin or bisphenol A novolac-epoxy resin, so long as it can still be used to form a film from the photosensitive resin layer.

(a) Alkali-Soluble Polymer Comprising a Carboxyl Group

The alkali-soluble polymer comprising a carboxyl group (a) preferably has an α,β-unsaturated carboxyl group-containing monomer as the polymerizing component, with the alkali-soluble polymer having 100 to 600 acid equivalents and a weight-average molecular weight of 5,000 to 500,000. The carboxyl groups in the alkali-soluble polymer comprising a carboxyl group are necessary in order for the photosensitive resin composition to have developability or releasability for the aqueous organic base solution (for example, the developing solution or release solution containing the aqueous alkali solution). An acid equivalent is the mass of alkali-soluble polymer with one equivalent of carboxyl groups. A more preferred lower limit for the acid equivalents is 250, and a more preferred upper limit is 450. The acid equivalents of the alkali-soluble polymer comprising a carboxyl group (a) is preferably 100 or greater from the viewpoint of improving development resistance and increasing resolution and adhesiveness between the cured photosensitive resin layer (or "cured resist film") and other members, and also from the viewpoint of ensuring compatibility with the other components in the solvent or photosensitive resin composition, and especially the addition polymerizable monomer (b) described below, while it is also preferably 600 or lower from the viewpoint of improving developability and releasability. The acid equivalent can be measured using a COM1750 Hiranuma Automatic Titrator by Hiranuma Sangyo Corp., based on potential difference titration, using 0.1 mol/L sodium hydroxide.

The weight-average molecular weight of the alkali-soluble polymer comprising a carboxyl group (a) is preferably 5,000 to 500,000. From the viewpoint of increasing the fluid resistance of the photosensitive resin laminate, inhibiting infiltration of air into the microchannels during lamination and resulting in a uniform thickness of the photosensitive resin laminate to obtain resistance against the developing solution, the weight-average molecular weight is preferably 5,000 or higher, while from the viewpoint of maintaining developability it is preferably 500,000 or lower. In order to obtain both fluid resistance and developability, the lower limit for the weight-average molecular weight of the alkali-soluble polymer comprising a carboxyl group (a) is more preferably 10,000 or higher, 20,000 or higher or 40,000 or higher, and the upper limit is preferably 250,000 or lower, 200,000 or lower, 150,000 or lower or 100,000 or lower.

The weight-average molecular weight, for the purpose of the present specification, is the weight-average molecular weight measured by gel permeation chromatography (GPC) using a calibration curve for polystyrene (Shodex STANDARD SM-105 by Showa Denko K.K.). The weight-average molecular weight of the alkali-soluble polymer comprising a carboxyl group (a) can be measured using a gel permeation chromatograph by JASCO Corp., under the following conditions:

Differential refractometer: RI-1530
Pump: PU-1580
Degasser: DG-980-50
Column oven: CO-1560
Column: KF-8025, KF-806 M×2, KF-807 in order
Eluent: THF The alkali-soluble polymer comprising a carboxyl group (a) is preferably a (co)polymer comprising one or more monomers selected from among the first or second monomers mentioned below.

The first monomer is a carboxylic acid or acid anhydride having one polymerizable unsaturated group in the molecule. Examples include (meth)acrylic acid, fumaric acid, cinnamic acid, crotonic acid, itaconic acid, maleic anhydride and maleic acid half esters. Particularly preferred is (meth) acrylic acid, from the viewpoint of the alkali developing property.

The second monomer is a monomer that is non-acidic and has at least one polymerizable unsaturated group in the molecule. Examples include vinyl alcohol esters such as methyl (meth)acrylate, ethyl (meth)acrylate, n-propyl (meth)acrylate, isopropyl (meth)acrylate, n-butyl (meth) acrylate, isobutyl (meth)acrylate, tert-butyl (meth)acrylate, 2-hydroxyethyl (meth)acrylate, 2-hydroxypropyl (meth) acrylate, cyclohexyl (meth)acrylate, 2-ethylhexyl (meth) acrylate, benzyl (meth)acrylate and vinyl acetate, as well as (meth)acrylonitrile, styrene and polymerizable styrene derivatives. From the viewpoint of resolution of the flow channel pattern, one or more selected from the group consisting of methyl (meth)acrylate, n-butyl (meth)acrylate, styrene, 2-ethylhexyl (meth)acrylate, 2-hydroxyethyl (meth) acrylate and benzyl (meth)acrylate are preferred, with benzyl (meth)acrylate being more preferred.

As used herein, the term "(meth)acrylic" means "acrylic" and its corresponding "methacrylic" compound, the term "(meth)acrylate" means "acrylate" and its corresponding "methacrylate", and the term "(meth)acryloyl" means "acryloyl" and its corresponding "methacryloyl".

The alkali-soluble polymer comprising a carboxyl group (a) can be synthesized by adding an appropriate amount of a radical polymerization initiator such as benzoyl peroxide or azoisobutyronitrile to a solution containing one or more of the monomers mentioned above mixed and diluted with a solvent such as acetone, methyl ethyl ketone or isopropanol, and heating and stirring the mixture. The synthesis may also be carried out while adding a portion of the mixture dropwise to the reaction mixture. Upon completion of the reaction, additional solvent may be added to the reaction product for adjustment to the desired concentration. The synthesis means used may be bulk polymerization, suspension polymerization or emulsion polymerization, instead of solution polymerization.

The copolymerization ratio of the first monomer and the second monomer for the alkali-soluble polymer comprising a carboxyl group (a) is preferably 10 to 60 mass % of the first monomer and 40 to 90 mass % of the second monomer, and more preferably 15 to 35 mass % of the first monomer and 65 to 85 mass % of the second monomer.

More specific examples for the alkali-soluble polymer comprising a carboxyl group (a) are: a polymer comprising methyl methacrylate, methacrylic acid and styrene as copolymerizing components, a polymer comprising methyl methacrylate, methacrylic acid and n-butyl methacrylate as copolymerizing components, a polymer comprising methacrylic acid, benzyl methacrylate and styrene as copolymerizing components, a polymer comprising methacrylic acid and benzyl methacrylate as copolymerizing components, and a copolymer comprising methacrylic acid, 2-ethylhexyl acrylate, 2-hydroxyethyl methacrylate and styrene as copolymerizing components.

The content of the alkali-soluble polymer comprising a carboxyl group (a) in the photosensitive resin composition is in the range of preferably 20 to 90 mass % and more preferably 40 to 60 mass %, based on the total solid content of the photosensitive resin composition. The content of the alkali-soluble polymer comprising a carboxyl group (a) is preferably 20 mass % or greater from the viewpoint of maintaining resistance of the photosensitive resin composition in photolithography, and preferably 90 mass % or lower from the viewpoint of flexibility of the photosensitive resin composition before curing and the resist pattern after curing.

(b) Addition Polymerizable Monomer

The addition polymerizable monomer (b) is a compound having at least one polymerizable ethylenically unsaturated bond in the molecule. An ethylenically unsaturated bond is preferably a terminal ethylenically unsaturated group. From the viewpoint of high resolution for the flow channel pattern and the shapes of the partitions, it is preferred to use one or more selected from the group consisting of bisphenol A-based (meth)acrylate compounds, polyfunctional monomers, monomers with alkylene oxide repeating units, cyclic monomers and aromatic monomers, as the addition polymerizable monomer (b).

As used herein, a "bisphenol A-based (meth)acrylate compound" is a compound having a (meth)acryloyl group or a carbon-carbon unsaturated double bond derived from a (meth)acryloyl group, and a $-C_6H_4-C(CH_3)_2-C_6H_4-$ group from bisphenol A. Specific examples include polyethylene glycol dimethacrylate with an average of 1 mol of ethylene oxide added to both ends of bisphenol A, polyethylene glycol dimethacrylate with an average of 2 mol of ethylene oxide added to both ends of bisphenol A (NK ester BPE-200 by Shin-Nakamura Chemical Co., Ltd.) or polyethylene glycol dimethacrylate with an average of 5 mol of ethylene oxide added to both ends of bisphenol A (NK ester BPE-500 by Shin-Nakamura Chemical Co., Ltd.), polyalkylene glycol dimethacrylate, bisphenol A with an average of 6 mol of ethylene oxide and an average of 2 mol of propylene oxide added to both ends of bisphenol A. and polyalkylene glycol dimethacrylate with an average of 15 mol of ethylene oxide and an average of 2 mol of propylene oxide added to both ends of bisphenol A.

Examples for the addition polymerizable monomer (b), other than bisphenol A-based (meth)acrylate compounds, include:

- 4-nonylphenylheptaethylene glycol dipropylene glycol acrylate, 2-hydroxy-3-phenoxypropyl acrylate, phenoxyhexaethylene glycol acrylate, reaction product of phthalic anhydride and 2-hydroxypropyl acrylate half ester compound and propylene oxide (trade name: OE-A200 by Nippon Shokubai Co., Ltd.), polyethylene glycol dimethacrylate with addition of an average of 4 mol ethylene oxide, glycol dimethacrylate with addition of an average of 3 mol of ethylene oxide to both ends of polypropylene glycol with addition of an average of 12 mol of propylene oxide, and polybutylene glycol dimethacrylate with addition of an average of 28 mol of butylene oxide;
- polyoxyalkylene glycol di(meth)acrylates such as 4-n-octylphenoxypentapropylene glycol acrylate, 1,6-hexanediol (meth)acrylate, 1,4-cyclohexanediol di(meth)acrylate, polypropylene glycol di(meth)acrylate and polyethylene glycol di(meth)acrylate, 2-di(p-hydroxyphenyl) propane di(meth)acrylate, glycerol tri(meth) acrylate, pentaerythritol tri, tetra and penta(meth)acrylates, and trimethylolpropane-triglycidyl ether tri (meth)acrylate;
- 2,2-bis(4-(meth)acryloxypentaethoxyphenyl)propane and 2,2-bis(4-((meth)acryloxypentaethoxy)cyclohexyl) propane; and
- poly functional group (meth)acrylates comprising urethane groups, such as urethanated hexamethylene diisocyanate and nonapropylene glycol monomethacrylate, polyurethane diol dimethacrylates, synthesized from hexamethylenediamine and polybutylene glycol with addition of an average of 28 mol of butylene oxide, and polyfunctional (meth)acrylates of isocyanuric acid ester compounds. Triacrylates with addition of an average of 3 mol of ethylene oxide to trimethylolpropane may also be mentioned. These may be used alone or in combinations of two or more, and they may also be used in combination with bisphenol A-based (meth)acrylate compounds.

The content of the addition polymerizable monomer (b) in the photosensitive resin composition is in the range of preferably 5 to 75 mass %, more preferably 15 to 70 mass % and even more preferably 20 to 55 mass %, based on the total solid content of the photosensitive resin composition. From the viewpoint of resolution, and adhesiveness between the cured resist film and other members, the content of the addition polymerizable monomer (b) is preferably 5 mass % or greater, while from the viewpoint of flexibility of the cured resist film it is preferably 75 mass % or lower.

(c) Photopolymerization Initiator

The photopolymerization initiator (c) used may be one commonly used as a photopolymerization initiator for photosensitive resins. One example to be used is hevaarylbisimidazole (hereunder also referred to as "triarylimidazolyl dimer").

Examples of triarylimidazolyl dimers include:

- 2-(o-chlorophenyl)-4,5-diphenylimidazolyl dimer (hereunder also referred to as "2,2'-bis(2-chlorophenyl)-4,4',5,5'-tetraphenyl-1,1'-bisimidazole") and 2,2',5-tris-(o-chlorophenyl)-4-(3,4-dimethoxyphenyl)-4',5'-diphenylimidazolyl dimer, 2,4-bis-(o-chlorophenyl)-5-(3,4-dimethoxyphenyl)-diphenylimidazolyl dimer;
- 2,4,5-tris-(o-chlorophenyl)-diphenylimidazolyl dimer, 2-(o-chlorophenyl)-bis-4,5-(3,4-dimethoxyphenyl)-imidazolyl dimer, 2,2'-bis-(2-fluorophenyl)-4,4',5,5'-tetrakis-(3-methoxyphenyl)-imidazolyl dimer, 2,2'-bis-(2,3-difluoromethylphenyl)-4,4',5,5'-tetrakis-(3-methoxyphenyl)-imidazolyl dimer, 2,2'-bis-(2,4-difluorophenyl)-4,4' and 5,5'-tetrakis-(3-methoxyphenyl)-imidazolyl dimer;
- 2,2'-bis-(2,5-difluorophenyl)-4,4',5,5'-tetrakis-(3-methoxyphenyl)-imidazolyl dimer, 2,2'-bis-(2,6-difluorophenyl)-4,4',5,5'-tetrakis-(3-methoxyphenyl)-imidazolyl dimer, 2,2'-bis-(2,3,4-trifluorophenyl)-4,4',5,5'-tetrakis-(3-methoxyphenyl)-imidazolyl dimer, 2,2'-bis-(2,3,5-trifluorophenyl)-4,4' and 5,5'-tetrakis-(3-methoxyphenyl)-imidazolyl dimer;
- 2,2'-bis-(2,3,6-trifluorophenyl)-4,4',5,5'-tetrakis-(3-methoxyphenyl)-imidazolyl dimer, 2,2'-bis-(2,4,5-trifluorophenyl)-4,4',5,5'-tetrakis-(3-methoxyphenyl)-imidazolyl dimer, 2,2'-bis-(2,4,6-trifluorophenyl)-4,4' and 5,5'-tetrakis-(3-methoxyphenyl)-imidazolyl dimer, and
- 2,2'-bis-(2,3,4,5-tetrafluorophenyl)-4,4',5,5'-tetrakis-(3-methoxyphenyl)-imidazolyl dimer, 2,2'-bis-(2,3,4,6-tetrafluorophenyl)-4,4' and 5,5'-tetrakis-(3-methoxyphenyl)-imidazolyl dimer and 2,2'-bis-(2,3,4,5,6-pentafluorophenyl)-4,4',5,5'-tetrakis-(3-methoxyphenyl)-imidazolyl dimer.

Particularly preferred for use is 2-(o-chlorophenyl)-4,5-diphenylimidazolyl dimer, because it has a high effect for resolution and cured resist film strength. Any of these may be used alone or in combinations of two or more, and they may also be used in combination with the acridine compounds and pyrazoline compounds mentioned below.

An acridine compound or pyrazoline compound may be used as the photopolymerization initiator (c). Acridine compounds include:

- acridine, 9-phenylacridine, 9-(4-tolyl) acridine, 9-(4-methoxyphenyl)acridine, 9-(4-hydroxyphenyl)acridine, 9-ethylacridine, 9-chloroethylacridine, 9-methoxyacridine and 9-ethoxyacridine;
- 9-(4-methylphenyl)acridine, 9-(4-ethylphenyl)acridine, 9-(4-n-propylphenyl)acridine, 9-(4-n-butylphenyl)acridine, 9-(4-tert-butylphenyl)acridine, 9-(4-ethoxyphenyl)acridine, 9-(4-acetylphenyl)acridine, 9-(4-dimethylaminophenyl)acridine and 9-(4-chlorophenyl) acridine; and
- 9-(4-bromophenyl)acridine, 9-(3-methylphenyl)acridine, 9-(3-tert-butylphenyl)acridine, 9-(3-acetylphenyl)acridine, 9-(3-dimethylaminophenyl)acridine, 9-(3-diethylaminophenyl)acridine, 9-(3-chlorophenyl)acridine, 9-(3-bromophenyl)acridine, 9-(2-pyridyl) acridine, 9-(3-pyridyl) acridine and 9-(4-pyridyl) acridine. Preferred among these is 9-phenylacridine.

An acridine compound is preferably used in combination with a halogenated compound from the viewpoint of curability after exposure of the photosensitive resin layer.

Examples of halogenated compounds include amyl bromide, isoamyl bromide, isobutylene bromide, ethylene bromide, diphenylmethyl bromide, benzal bromide, methylene bromide, tribromomethylphenylsulfone, carbon tetrabromide, tris(2,3-dibromopropyl)phosphate, trichloroacetamide, amyl iodide, isobutyl iodide, 1,1,1-trichloro-2,2-bis(p-chlorophenyl)ethane, hexachloroethane and chlorinated triazine compounds. Tribromomethylphenylsulfone is preferred from the viewpoint of curability.

Preferred pyrazoline compounds include 1-phenyl-3-(4-tert-butyl-styryl)-5-(4-tert-butyl-phenyl)-pyrazoline, 1-(4-(benzooxazol-2-yl)phenyl)-3-(4-tert-butyl-styryl)-5-(4-tert-butyl-phenyl)-pyrazoline, 1-phenyl-3-(4-biphenyl)-5-(4-tert-butyl-phenyl)-pyrazoline and 1-phenyl-3-(4-biphenyl)-5-(4-tert-octyl-phenyl)-pyrazoline.

Examples of other photopolymerization initiators include:

- quinones such as 2-ethylanthraquinone, octaethylanthraquinone, 1,2-benzanthraquinone, 2,3-benzanthraquinone, 2-phenylanthraquinone, 2,3-diphenylanthraquinone, 1-chloroanthraquinone, 1,4-naphthoquinone, 9,10-phenanthraquinone, 2-methyl-1,4-naphthoquinone, 2,3-dimethylanthraquinone and 3-chloro-2-methylanthraquinone;
- aromatic ketones, such as benzophenone, Michler's ketone [4,4'-bis(dimethylamino)benzophenone] and 4,4'-bis(diethylamino)benzophenone, benzoin, and benzoin ethers such as benzoin ethyl ether, benzoin phenyl ether, methylbenzoin and ethylbenzoin; and
- oxime esters such as benzyldimethylketal, benzyldiethylketal, combinations of thioxanthones with alkylaminobenzoic acids, 1-phenyl-1,2-propanedione-2-O-benzoinoxime and 1-phenyl-1,2-propanedione-2-(O-ethoxycarbonyl) oxime.

Oxime compounds are preferred when the microchannels must be colorless transparent, or from the viewpoint of inhibiting fluorescence to facilitate detection of luminescent signals in the microfluidic device. Examples include Irgacure OXE01 and Irgacure OXE02 by BASF Japan. and ADEKA ARKLS NCI-831 by Adeka Corp.

Examples of combinations of thioxanthones with alkylaminobenzoic acids include a combination of ethylthioxanthone and ethyl dimethylaminobenzoate, a combination of 2-chlorthioxanthone and ethyl dimethylaminobenzoate, and a combination of isopropylthioxanthone and ethyl dimethylaminobenzoate. An N-arylamino acid may also be used. Examples of N-arylamino acids include N-phenylglycine. N-methyl-N-phenylglycine and N-ethyl-N-phenylglycine. Especially preferred among these is N-phenylglycine.

The content of the photopolymerization initiator (c) in the photosensitive resin composition is preferably in the range of 0.01 to 30 mass % based on the total solid content of the photosensitive resin composition, the lower limit being more preferably 0.05 mass % or greater and even more preferably 0.1 mass % or greater, and the upper limit being more preferably 15 mass % or lower and even more preferably 10 mass % or lower. The content of the photopolymerization initiator (c) is preferably 0.01 mass % or greater from the viewpoint of obtaining adequate sensitivity during exposure photopolymerization, and it is preferably 30 mass % or lower from the viewpoint of allowing light to sufficiently permeate the bottom of the photosensitive resin composition during photopolymerization (that is, the section furthest from the light source), and to obtain satisfactory resolution and satisfactory adhesiveness between the cured resist film and other members.

(d) Other Additives

The photosensitive resin composition may also comprise various other additives in addition to components (a) to (c).

For example, the photosensitive resin composition preferably further comprises one or more compounds selected from the group consisting of radical polymerization inhibitors, benzotriazoles, carboxybenzotriazoles and hindered phenol-based antioxidants, in order to improve the thermal stability and storage stability of the photosensitive resin composition.

Examples of radical polymerization inhibitors include p-methoxyphenol, hydroquinone, pyrogallol, naphthylamine, tert-butylcatechol, cuprous chloride, 2,6-di-tert-butyl-p-cresol, 2,2'-methylenebis(4-methyl-6-tert-butylphenol), 2,2'-methylenebis(4-ethyl-6-tert-butylphenol), nitrosophenylhydroxyamine aluminum salt (N-nitroso-N-phenylhydroxylamine aluminum) and diphenylnitrosoamine.

Examples of benzotriazoles include 1,2,3-benzotriazole, 1-chloro-1,2,3-benzotriazole, bis(N-2-ethylhexyl)aminomethylene-1,2,3-benzotriazole, bis(N-2-ethylhexyl)aminomethylene-1,2,3-tolyltriazole and bis(N-2-hydroxyethyl)aminomethylene-1,2,3-benzotriazole.

Examples of carboxybenzotriazoles include 4-carboxy-1,2,3-benzotriazole, 5-carboxy-1,2,3-benzotriazole, (N,N-dibutylamino) carboxy benzotriazole, N—(N,N-di-2-ethylhexyl)aminomethylenecarboxybenzotriazole, N—(N,N-di-2-hydroxyethyl)aminomethylenecarboxybenzotriazole and N—(N,N-di-2-ethylhexyl)aminoethylenecarboxybenzotriazole.

Examples of hindered phenol-based antioxidants include the IRGANOX Series by BASF Japan, and the ADEKASTAB (AO) Series by Adeka Corp.

Another polymerization inhibitor is ethylene bis(oxyethylene)bis(3-5-tert-butyl-4-hydroxy-m-tolyl) propionate (trade name: IRGANOX 245).

The total amount of addition of radical polymerization inhibitors, benzotriazoles, carboxybenzotriazoles and/or hindered phenol-based antioxidants is preferably 0.001 to 3 mass %, the lower limit more preferably being 0.05 mass % or greater and the upper limit more preferably being 1 mass % or lower, based on the total solid content of the photosensitive resin composition. The total amount of addition is preferably 0.001 mass % or greater from the viewpoint of imparting storage stability to the photosensitive resin composition, and it is preferably 3 mass % or lower from the viewpoint of maintaining sensitivity.

The photosensitive resin composition may also contain another coloring substance if necessary. Examples of such coloring substances include coloring dyes such as Phthalocyanine green, Crystal violet, Methyl orange. Nile blue 2B. Victoria blue, Malachite green, Basic blue 20 and Diamond green, or leuco dyes or combinations of fluorane dyes with halogenated compounds.

Examples of leuco dyes include tris(4-dimethylamino-2-methylphenyl)methane [leuco crystal violet] and tris(4-dimethylamino-2-methylphenyl)methane [leuco malachite green], as well as fluorane dyes.

Examples of halogenated compounds include amyl bromide, isoamyl bromide, isobutylene bromide, ethylene bromide, diphenylmethyl bromide, benzal bromide, methylene bromide, tribromomethylphenylsulfone, carbon tetrabromide, tris(2,3-dibromopropyl)phosphate, trichloroacetamide, amyliodide, isobutyl iodide, 1,1,1-trichloro-2,2-bis (p-chlorophenyl) ethane, hexachloroethane and chlorinated triazine compounds.

The photosensitive resin composition may also contain a plasticizer if necessary. Examples of plasticizers include compounds obtained by poly alkylene oxide modification of bisphenol A. Additional examples include sorbitan derivatives such as polyoxyethylene sorbitan laurate and polyoxyethylene sorbitan oleate, polyalkylene glycols such as polyethylene glycol and polypropylene glycol, phthalic acid esters such as diethyl phthalate, and plasticizers such as o-toluenesulfonic acid amide, p-toluenesulfonic acid amide, tributyl citrate, triethyl citrate, triethyl acetylcitrate, tri-n-propyl acetylcitrate and tri-n-butyl acetylcitrate. It is particularly preferred to use a sorbitan derivative or a polyalkylene glycol.

The content of a plasticizer in the photosensitive resin composition is preferably 1 to 50 mass %, with the lower limit being more preferably 3 mass % and the upper limit being more preferably 30 mass %, based on the total solid content of the photosensitive resin composition. From the viewpoint of inhibiting developing time retardation and imparting flexibility to the cured film, the content is preferably 1 mass % or greater, while from the viewpoint of avoiding a situation of insufficient curing, it is preferably 50 mass % or lower.

According to one aspect, the thickness of the photosensitive resin layer is preferably 100 μm or greater, more preferably 120 μm or greater and even more preferably 240 μm or greater, and preferably 720 μm or smaller and more preferably 480 μm or smaller.

<Support Film>

The support film supports the photosensitive resin layer as a film. The support film is preferably one that is permeable to light with a wavelength of 510 nm to 600 nm, and light emitted from the exposure light source. Such support films include polyethylene terephthalate films, polyvinyl alcohol films, polyvinyl chloride films, vinyl chloride copolymer films, polyvinylidene chloride films, vinylidene chloride copolymer films, poly(methyl methacrylate) copolymer films, polystyrene films, polyacrylonitrile films, styrene copolymer films, polyamide films and cellulose derivative films. Such films may also be stretched if necessary. From the viewpoint of resolution, a film with a haze value of 5 or lower is preferred. A haze value of 3 or lower is more preferred, a haze value of 2.5 or lower is even more preferred, and a haze value of 1 or lower is yet more preferred. While a thinner thickness of the support film is advantageous in terms of image formability and economy, it is preferably 10 to 30 μm from the viewpoint of the film thickness of the photosensitive resin laminate, and of reducing the effect of heat shrinkage during coating of the photosensitive resin layer. Examples include GR-19 and GR-16 by Teijin Film, Ltd., R310-16 and R340G16 by Mitsubishi Plastics, Inc., and FB40 (film thickness: 16 μm) and FB60 (film thickness: 16 μm) by Toray Polyester Film Co. Ltd.

<Protective Film>

According to one aspect, the photosensitive resin laminate of the embodiment is preferably combined with a protective film. According to another aspect, the protective film is disposed on the photosensitive resin laver. The protective film may be any desired film that has lower adhesive force with the photosensitive resin layer than the support film, and that can thus be released. For example, a polyethylene film, polypropylene film or stretched polypropylene film may be used as the protective film. The film with excellent releasability disclosed in Japanese Unexamined Patent Publication SHO No. 59-202457, for example, may also be used. The protective film is preferably a polypropylene film or release-treated plastic film, from the viewpoint of being released from the photosensitive resin laminate during formation of the microfluidic device, and from the viewpoint of satisfactory releasability.

The film thickness of the protective film is preferably 10 to 100 μm and more preferably 10 to 50 μm, from the viewpoint of the film thickness and dimensional stability of the layered combination of the photosensitive resin laminate and protective film. Specific examples of protective films include the release-treated PET film 25X by Lintec Corp. (film thickness: 25 μm), and GF-18, GF-818 and GF-858 by Tamapoly Co., Ltd.

<Production Method for Photosensitive Resin Laminate>

The method for producing the photosensitive resin laminate may be any known method. For example, the photosensitive resin composition to be used to form the photosensitive resin layer may be mixed with a solvent to prepare a photosensitive resin composition solution, coating and drying it onto a support film using a blade coater or roll coater, and laminating the photosensitive resin layer composed of the photosensitive resin composition onto a support film. Optionally, a protective film may additionally be layered over the photosensitive resin layer.

The solvent is preferably added to the photosensitive resin composition solution to a viscosity of 500 to 4000 mPa·sec at 25 °C. The solvent used may be appropriately selected from among methyl ethyl ketone, acetone, ethanol, methanol, propanol, propyleneglycol monomethyl ether, propyleneglycol monomethyl ether acetate and toluene, in consideration of the viscosity, drying property, residual solvent amount, coatability or foamability of the photosensitive resin composition solution.

The photosensitive resin laminate may be wound up on a winding core, and optionally layered with a protective film, for use as a roll. The photosensitive resin laminate may also be covered with a light-shielding sheet such as a polyethylene film, from the viewpoint of inhibiting adhesion of foreign matter, as well as photosensitivity during storage and transport.

[Production Method for Microfluidic Device]

<Overview>

According to a typical aspect, the photosensitive resin laminate of the embodiment is included in a microfluidic device as an exposed permanent film. According to one aspect, following exposure of the photosensitive resin layer, the support film is removed and the cured resist film alone is left in the microfluidic device. According to another aspect, the support film is not removed following exposure of the photosensitive resin layer, leaving both the support film and the cured resist film in the microfluidic device.

The microfluidic device can be produced by a method that includes a step of forming a flow channel pattern on a base material, and a step of laminating a cover material on the microchannel to seal the flow channel pattern. An example of using the photosensitive resin laminate of the embodiment as a partition material will now be described.

The process for producing the microfluidic device has:

(i-1) a step of coating a photosensitive resin composition solution containing a solvent with a boiling point of below 100 °C onto a support and drying it to form a photosensitive resin layer containing an alkali-soluble resin on the support.

(i-2) a step of laminating the photosensitive resin layer onto a base material, a step of forming a photosensitive resin layer containing an alkali-soluble resin, (ii) a step of developing the laminated photosensitive resin layer with an aqueous organic base solution to form a flow channel pattern, and (iii) a step of surface-treating the flow channel pattern by heat treatment of the flow channel pattern, thereby forming a resin region obtained from the alkali-soluble resin.

In the infrared absorption spectrum by infrared spectroscopy of the resin region, the ratio (Aa/Ac) between:

the maximum peak intensity (Aa) in a first range of 1555 to 1575 $cm^{-1}$ and the maximum peak intensity (Ac) in a second range of 1715 to 1735 $cm^{-1}$, is greater than 0 and 0.200 or lower.

The ratio (Aa/Ac) was explained above.

The preferred aspects for the structure described above, including but not limited to the ratio (Aa/Ac), may be assumed to be the preferred aspects for the production process of this embodiment as well.

In step (i-1), the photosensitive resin composition solution containing the solvent with a boiling point of below 100 °C is coated onto the support and dried. This allows a photosensitive resin layer containing an alkali-soluble resin to be formed on the support. The photosensitive resin composition solution may include the solvent with a boiling point of below 100 °C at 80 mass % or greater of the total solvent.

In step (i-2), the photosensitive resin layer is laminated on the base material. For example, it may be laminated onto the base material so that the photosensitive resin layer side of the photosensitive resin laminate faces the base material In step (ii), the pattern corresponding to the desired shape for the partition material is exposed, and the support film is removed, to allow development. In other words, step (ii) may have a step of exposing the photosensitive resin layer prior to development. This allows for satisfactory formation of multiple partition materials defining microchannels, which are composed of the cured resist film.

Preferably, direct imaging exposure without a mask is carried out during the exposure step in step (ii). This type of structure can reduce unwanted movement of fluid caused by capillary action, even with fine patterns obtained by direct imaging exposure.

In step (ii), the aqueous organic base solution may be an aqueous solution that functions as an alkali developing solution, being able to develop the alkali-soluble polymer comprising a carboxyl group. Examples include aqueous solutions of tetramethylammonium hydroxide (TMAH), dimethylaminoethanol (DMAE), ammonia, monoethanolamine, diethanolamine, triethanolamine and triethylamine.

In step (iii), the flow channel pattern is heat treated for surface treatment of the flow channel pattern, thus forming a resin region obtained from the alkali-soluble resin.

The heat treatment may be carried out using a hot air circulation oven (such as SF-100C by Asahi Kagaku).

The heating temperature (curing temperature) is preferably 90 to 180 °C, more preferably 110 to 160 °C and even more preferably 120 to 150 °C.

The heating time (curing time) is preferably 30 to 700 minutes, more preferably 60 to 450 minutes and even more preferably 90 to 400 minutes.

By heat treatment, carboxylic acid salts that form or remain in the resulting pattern are more easily converted to carboxylic acids or carboxylic acid esters, thus facilitating formation of a resin region with a ratio (Aa/Ac) of greater than 0 and 0.200 or lower.

Step (iii) may be followed by (iv) a microchannel sealing step. In this step, the photosensitive resin laminate is laminated on at least the partition material so as to cover the flow channel pattern, with the photosensitive resin layer side facing the partition material, and the entire surface is exposed to light, to form a cover material composed of the support film and cured resist film, typically without removing the support film.

The photosensitive resin laminate preferably has a degree of vacuum of 30 to 70 Pa and more preferably has a degree of vacuum of 40 to 60 Pa, in a reduced pressure state, from the viewpoint of forming the cured resist film with dimensional precision.

When forming a cured resist film having a multilayer structure, either lamination of a single photosensitive resin layer followed by exposure and development may be repeated several times, or exposure may be carried out once after lamination of multiple photosensitive resin layers. Single exposure is preferred as it allows formation of a cured resist film with superior dimensional precision (i.e. less positional shifting between layers).

The photosensitive resin laminate of the embodiment is most suitably applied for the partition material and/or cover material of a compact disc (CD) ELISA microfluidic device. An example of a CD ELISA device construction will now be described.

<Method for Producing CD ELISA Device>

According to an exemplary aspect, the method for producing the CD ELISA device includes the following steps:

(1) a step of forming multiple partitions on a base material to create a flow channel pattern;

(2) a step of forming through-holes in the base material;

(3) a step of fitting analyzers through the through-holes, from the back side of the base material;

(4) a step of laminating a cover material from the front side of the base material;

(5) optionally, a step of partially shaving the base material on which the flow channel pattern is formed to adjust the outer shape; and (6) optionally, a step of cleaning the partition. The order of the steps may be freely adjusted for efficiency of the production steps.

When step (1) is to be carried out by photolithography, the protective film (when present) may be released from the photosensitive resin laminate (the photosensitive resin laminate of the embodiment, if it is to be used for the partition material), maintaining the support film while laminating onto the base material, and it may be exposed and developed, after which the support film may be removed to form multiple partition materials defining the microchannels.

When step (4) is to be carried out by photolithography, the photosensitive resin laminate (the photosensitive resin laminate of the embodiment, if it is to be used for the cover material), may be laminated onto the base material and cured by exposure, to form a permanent film composed of the support film and cured resist film. Specifically, the protective film (when present) may be released from the photosensitive resin laminate, and while maintaining the support film, the support film, photosensitive resin layer, CD ELISA device base material, CD ELISA device analyzers and if necessary surface irregularities on the ELISA base material may be laminated at about 0.18 m/min in the specified lamination order, using a two-axle roll in a flat-aligning jig. The jig is preferably made of a material with low adhesion for the resist even during lamination, such as TEFLON™.

A structure comprising microchannels and a process for its production according to this embodiment, as well as a microfluidic device, will now be described. The embodiment is only one aspect of the invention, and it may incorporate various modifications that are not outside of the gist of the invention.

For example, the embodiment described was a case where the partition material includes resin regions. However, the resin regions may also be included in the base material, or they may be included in the cover material. In both cases, whether the base material includes the resin regions or the cover material includes the resin regions, the same method may be applied as for when the partition material includes the resin regions.

When the base material includes the resin regions, for example, the process may also have a step of developing the base material formed of the alkali-soluble resin, using an aqueous organic base solution, to form a flow channel pattern.

When the cover material includes the resin regions, the process may also have a step of developing the cover material formed of the alkali-soluble resin, using an aqueous organic base solution, to form a flow channel pattern.

In either case, this may be followed by a step of creating resin regions made of the soluble resin, as explained for the embodiment above, forming the resin regions on the base material and/or cover material.

EXAMPLES

The present invention will now be explained using Examples and Comparative Examples.

[Fabrication of Evaluation Samples]

The evaluation samples for the Examples and Comparative Examples were prepared in the following manner.

<Fabrication of Photosensitive Resin Laminate 1>

Photosensitive resin composition 1A having the composition as listed in Table 1 (where "content" represents solid content (parts by mass)) and ethanol as a solvent, were mixed and stirred to obtain a mixed liquid. The mixed liquid was coated onto the surface of a 16 μm-thick polyethylene terephthalate film (FB40k by Toray Co., Ltd.) as the support, using a blade coater. Drying was then carried out for 40 minutes at 95 °C to form photosensitive resin layer 1B, thereby obtaining photosensitive resin laminate 1. The thickness of photosensitive resin layer 1B was 120 μm.

A GF-818 film by Tamapoly Co., Ltd. was then attached as a protective film onto the surface of the photosensitive resin layer 1B on the opposite side from the support side.

<Fabrication of Photosensitive Resin Laminate 2>

Photosensitive resin composition 2A having the composition as listed in Table 2 (where "content" represents solid content (parts by mass)) and ethanol as a solvent, were mixed and stirred to obtain a mixed liquid. The mixed liquid was coated onto the surface of a 16 μm-thick polyethylene terephthalate film (FB40k by Toray Co., Ltd.) as the support, using a blade coater. Drying was then carried out for 5 minutes at 95 °C to form photosensitive resin layer 2B, thereby obtaining photosensitive resin laminate 2. The thickness of photosensitive resin layer 2B was 5 μm.

A GF-818 film by Tamapoly Co. Ltd. was then attached as a protective film onto the surface of the photosensitive resin layer 2B on the opposite side from the support side.

<Fabrication of Photosensitive Resin Laminate 3>

Photosensitive resin composition 3A having the composition as listed in Table 2 (where "content" represents solid content (parts by mass)) and ethanol as a solvent, were mixed and stirred to obtain a mixed liquid. The mixed liquid was coated onto the surface of a 16 μm-thick polyethylene terephthalate film (FB40k by Toray Co., Ltd.) as the support, using a blade coater. Drying was then carried out for 5 minutes at 95 °C to form photosensitive resin layer 3B, thereby obtaining photosensitive resin laminate 3. The thickness of photosensitive resin layer 3B was 50 μm.

A GF-818 film by Tamapoly Co., Ltd. was then attached as a protective film onto the surface of the photosensitive resin layer 3B on the opposite side from the support side.

TABLE 1

| Type | Compound (representing solid portion). | Photosensitive resin composition 1A | Photosensitive resin composition 2A | Photosensitive resin composition 3A |
|---|---|---|---|---|
| (a) Alkali-soluble polymer | 40 mass % solid methyl ethyl ketone solution of methacrylic acid/benzyl methacrylate (weight ratio: 20/80) copolymer (weight-average molecular weight: 70,000) | 55 | — | — |
| | 40 mass % solid methyl ethyl ketone solution of methacrylic acid/benzyl methacrylate (weight ratio: 20/80) copolymer (weight-average molecular weight: 55,000) | — | 50 | — |
| | 40 mass % solid methyl ethyl ketone solution of methacrylic acid/methyl methacrylate/butyl acrylate (weight ratio: 25/50/25) copolymer (weight-average molecular weight: 55,000) | — | — | 23 |
| | 30 mass % solid methyl ethyl ketone solution of methacrylic acid/methyl methacrylate/styrene (weight ratio: 25/65/10) copolymer (weight-average molecular weight: 150,000) | — | — | 23 |
| (b) Addition polymerizable monomer | Triacrylate with average 3 mol ethylene oxide added to trimethylolpropane | 27 | — | — |
| | Dimethacrylate of polyethylene glycol with average 4 mol ethylene oxide added | 3 | — | — |
| | Polyalkylene glycol dimethacrylate with average 1 mol ethylene oxide added at both ends of bisphenol A | 9 | — | 5 |
| | 40% Solid methyl ethyl ketone solution of polyurethanediol dimethacrylate, synthesized from polybutylene glycol with average 28 mol butylene oxide added, and hexamethylenediamine (weight-average molecular weight: 20,000) | — | 50 | — |
| | Methacrylic acid ester obtained by successive addition of average 7 mol ethylene oxide and average 2 mol propylene oxide to nonylphenol, and condensation of terminal hydroxyl and methacrylic acid | | | 5 |
| | Polyalkylene glycol dimethacrylate with average 1 mol ethylene oxide added at both ends of bisphenol A | | | 15 |
| | Polyethylene glycol dimethacrylate with average 3 mol ethylene oxide added at each of both ends of average 12 mol propylene oxide | | | 10 |
| (c) Photo-polymerization initiator or its | 4,4'-bis(Diethylamino)benzophenone | 0.015 | — | 0.15 |
| | 2-(o-Chlorophenyl)-4,5-diphenylimidazolyl dimer | 3 | — | 4 |
| | 9-Phenylacridine | — | 0.4 | — |

TABLE 1-continued

| Type | Compound (representing solid portion). | Photosensitive resin composition 1A | Photosensitive resin composition 2A | Photosensitive resin composition 3A |
|---|---|---|---|---|
| decomposition product | N-Phenylglycine | — | 0.2 | — |
| | Tribromomethylphenylsulfone | — | 0.7 | — |
| (d) Inhibitor | Ethylene bis(oxyethylene)bis(3-5-tert-butyl-4-hydroxy-m-tolyl) propionate (trade name: IRGANOX 245) | 0.05 | — | — |
| | N-Nitroso-N-phenylhydroxylaminealuminum | — | 0.01 | — |
| Dye | C.I. Basic Green 1 | | | 0.05 |
| | Leuco crystal violet | | | 0.5 |
| Plasticizer | para-Toluenesulfonamide | | | 5 |
| | Polyalkylene glycol with average 2 mol propylene glycol added at both ends of bisphenol A | | | 10 |
| | Total | 97.065 | 101.31 | 100.7 |

Example 1

<Fabrication of Base Material>

The protective film on the photosensitive resin laminate 3 was released, and the photosensitive resin laminate was layered onto the base material with the release surface against the glass substrate (0.9 mm thickness). A laminate was thus obtained as a laminate of the base material, a 50 μm photosensitive resin layer and the support. The lamination was carried out using an ordinary pressure laminator (VA-400III by Taisei Laminator Co., Ltd.), under conditions with a speed of 0.2 m/min, a cylinder pressure of 0.2 MPa and a roll temperature of 70 °C.

The support on the photosensitive resin laminate 3 was then released.

The protective film on the photosensitive resin laminate 1 was subsequently released and the photosensitive resin laminate was laminated with its release surface against the photosensitive resin layer of the photosensitive resin laminate 3. A laminate was thus obtained as a laminate of the base material, the 50 μm photosensitive resin layer 3, the photosensitive resin layer 1 and the support. The lamination was carried out using an ordinary pressure laminator (VA-400III by Taisei Laminator Co. Ltd.), under conditions with a speed of 0.2 m/min. a cylinder pressure of 0.2 MPa and a roll temperature of 70 °C.

The photosensitive resin layer of the laminate was then exposed to light. The light exposure was carried out using an HMW-201 KB scattered light exposure apparatus by Ore Manufacturing Co., Ltd., under 500 mJ/cm$^2$ conditions. A multilayer structure base material comprising a photosensitive resin layer (first layer), an adhesive layer and a glass substrate (second layer) was thus fabricated.

<Formation of Flow Channel Pattern>

The protective film on the photosensitive resin laminate 1 (also to be referred to as "first photosensitive resin laminate 1-1") was released and the first photosensitive resin laminate 1-1 was laminated onto the first layer with its release surface against the first layer. A laminate was thus obtained as a laminate of a base material, a 120 μm photosensitive resin layer and a support. The lamination was carried out using an ordinary pressure laminator (VA-400III by Taisei Laminator Co., Ltd.), under conditions with a speed of 0.2 m/min. a cylinder pressure of 0.2 MPa and a roll temperature of 70 °C.

The support film was released from the first photosensitive resin laminate 1-1 and the photosensitive resin layer 1B was exposed to light. The protective film on a separate photosensitive resin laminate 1 (also to be referred to as "second photosensitive resin laminate 1-2") was also released, and the second photosensitive resin laminate 1-2 was laminated with the photosensitive resin layer 1B of the release surface (the photosensitive resin layer 1B of the second photosensitive resin laminate 1-2) against the photosensitive resin layer 1B laminated on the base material (the photosensitive resin layer 1B of the first photosensitive resin laminate 1-1). A laminate was thus obtained as a laminate of a base material, a 240 μm (120 μm×2) photosensitive resin layer and a support. The lamination was carried out by the same method as described above.

By further repeating this method, laminate X was obtained as a laminate of a base material, a 720 μm (120 μm×6) photosensitive resin layer and a support.

The laminate X was exposed to light through the photosensitive resin pattern shown in FIG. 1. The light exposure was carried out using a Nuvogo Fine 10 by Japan Orbotech. Ltd., under conditions of 2000 mJ/cm$^2$ and an i-h light ray percentage of 0% to 100%.

After then releasing the support film from the laminate X, spray development was carried out over a developing time of 1.5× the minimum development time, to create a pattern. The development was carried out using an AD-1200 wafer developing machine by Takizawa Co., Ltd., with the developing solution as listed in the table. The "minimum development time" referred to here is the time at which the base material surface can first be seen during the development process.

After development, the film was washed with purified water for 60 seconds and dried. The created pattern was then heated (cured). The heating was carried out using a hot air circulation oven under the conditions listed in Table 2.

A #9795 microchannel sealant by 3M Co. (listed as "sealant" in Table 3) was then laminated at ordinary temperature to seal the partition material. A structure comprising microchannels for Example 1 was fabricated in this manner.

The partition material may also be sealed by the following method. Specifically, the protective film on the photosensitive resin laminate 2 is released and the photosensitive resin layer 2B on the release surface is laminated against the structure (photosensitive resin layer). It is then exposed with a scattered light exposure apparatus (HMW-201 KB by Orc Manufacturing Co., Ltd.) at 500 ml/cm$^2$, to form a cover material sealing the partition material.

[Example 2] to [Example 6], and [Comparative Example 1] to [Comparative Example 4]

Structures comprising microchannels were fabricated in the same manner as Example 1, except for using the conditions listed in Table 2.

Comparative Example 3

Structures comprising microchannels were fabricated for Comparative Example 3 in the same manner as Example 1, except for using the conditions listed in Table 2. For Comparative Example 3, the temperature and time for heating (curing) were different from Example 1. As shown in Table 3, the process conditions of Example 2 were used to fabricate Example 4 where the bottom of the flow channel was an acrylic resin. Example 5 which used a photosensitive resin laminate for the covering surface. Example 6 which had a different height for the partition material, and Comparative Example 4 which had a silicon wafer for the bottom of the flow channel.

<Evaluation>

The structure was evaluated by the following procedure.

For Examples in which the resin region has been formed on the partition material, evaluation of the resin region may be carried out using the structure before sealing of the cover material. The water contact angle on the flow channel-forming surfaces of the substrate can likewise be evaluated using the structure before sealing of the cover material. Since droplets from a syringe are used for measurement of the contact angle, it is difficult to directly measure the contact angle on the flow channel surfaces of partitions with heights of several tens to several hundred μm. Since the cured photosensitive resin composition layer of the embodiment has high uniformity, for the purpose of the present specification the contact angle on the surface of the photosensitive resin composition layer, i.e. the surface that is later to be in contact with the cover material, is considered to be equivalent to the contact angle on the flow channel surface. For convenience of measurement in the Examples, therefore, evaluation was conducted on the surface of the flow channel pattern of the structure before sealing with the cover material (photosensitive resin laminate 2).

In a scenario where the microfluidic device is actually employed, however, the structure is used after sealing of the cover material. Formation of the cover material does not significantly affect the evaluation results or trends, so long as the gist of the Examples is maintained. The evaluation results and trends are considered to likewise apply in scenarios where the microfluidic device is actually employed.

(Infrared Absorption Spectrum)

The infrared absorption (IR) spectrum based on infrared spectroscopy was measured under the following conditions using the structure before sealing with the photosensitive resin laminate 2.

Apparatus: Nicolet iN10 infrared microscope by Thermo Fisher Scientific Co.

Measuring method: Attenuated Total Reflection (ATR reflection) method, prism: Tip ATR 350 (Ge ATR slide plate)

Nuumber of scans: 64

Identification:

Maximum peak intensity (Aa): The maximum peak intensity near 1565 $cm^{-1}$ (for example, a first range of 1555 to 1575 $cm^{-1}$). The first range includes absorption intensity corresponding to stretching vibration of carbonyl (C═O) bonds in carboxylates.

Maximum peak intensity (Ab): The maximum peak intensity near 1700 $cm^{-1}$ (for example, a fourth range of 1690 to 1710 $cm^{-1}$). The fourth range includes absorption intensity corresponding to stretching vibration of carbonyl (C═O) bonds in carboxylic acid.

Maximum peak intensity (Ac): The maximum peak intensity near 1725 $cm^{-1}$ (for example, a second range of 1715 to 1735 $cm^{-1}$). The second range includes absorption intensity corresponding to stretching vibration of ester-derived carbonyl (C═O) bonds.

Maximum peak intensity (Ad): The maximum peak intensity near 1635 $cm^{-1}$ (for example, a third range of 1625 to 1645 $cm^{-1}$). The third range includes absorption intensity corresponding to stretching vibration of carbon-carbon (C═C) bonds occurring with carbon-carbon double bonds.

(Contact Angle)

The contact angle was measured under the following conditions using the structure before sealing with the photosensitive resin laminate 2. The measurement location was the flow channel surface of the base material.

Contact angle meter: LSE-A110 by NIC.

Droplets: purified water, 2 μL

Measurement: 60 seconds after liquid contact (Confirmation of Capillary Action)

After dropping 10 μL droplets (purified water) onto the flow channel pattern of the structure before sealing with the photosensitive resin laminate 2, the strength of capillary action was observed in an environment of 23 °C, 50% RH. A greater amount of liquid delivery by capillary action was evaluated as more difficult control of liquid delivery.

A (Satisfactory): Almost no delivery of liquid droplets.

B (Acceptable): Liquid droplets spread along pattern, but with distinctly observable droplet tips.

C (Poor): Liquid droplets spread along pattern, without distinctly observable droplet tips.

The measurement results are shown in Table 2 and Table 3.

TABLE 2

| | Developing solution | Minimum development time [sec] | Curing temperature [°C] | Curing time [hr] | IR absorption $A_a$ 1565 $cm^{-1}$ C═O from carboxylates | IR absorption $A_b$ 1700 $cm^{-1}$ C═O from carboxylic acid |
|---|---|---|---|---|---|---|
| Example 1 | 30 °C, 2.38% Tetramethylammonium hydroxide (TMAH) aqueous solution | 274 | 135 | 2 | 0.014 | 0.052 |
| Example 2 | 30 °C, 2.38% Tetramethylammonium hydroxide (TMAH) aqueous solution | 274 | 135 | 6 | 0.001 | 0.054 |

TABLE 2-continued

| | | | | | | |
|---|---|---|---|---|---|---|
| Example 3 | 30 °C, 3% Dimethylaminoethanol (DMAE) aqueous solution | 274 | 135 | 6 | 0.004 | 0.096 |
| Comparative Example 1 | 30 °C, 2.38% Tetramethylammonium hydroxide (TMAH) aqueous solution | 274 | No curing | — | 0.046 | 0.043 |
| Comparative Example 2 | 30 °C, 1.0% Sodium carbonate aqueous solution | 704 | 135 | 6 | 0.036 | 0.059 |
| Comparative Example 3 | 30 °C, 1.0% Sodium carbonate aqueous solution | 704 | 120 | 0.5 | 0.040 | 0.060 |

| | IR absorption $A_c$ 1725 $cm^{-1}$ C=O from esters | IR absorption $A_d$ 1635 $cm^{-1}$ C=C from carbon-carbon double bonds | Aa/Ac | Ad/Ac | Contact angle [°] | Capillary action |
|---|---|---|---|---|---|---|
| Example 1 | 0.172 | 0.024 | 0.081 | 0.138 | 64 | A |
| Example 2 | 0.183 | 0.021 | 0.005 | 0.114 | 71 | A |
| Example 3 | 0.209 | 0.018 | 0.020 | 0.086 | 68 | A |
| Comparative Example 1 | 0.128 | 0.030 | 0.359 | 0.231 | 38 | C |
| Comparative Example 2 | 0.150 | 0.026 | 0.240 | 0.172 | 59 | C |
| Comparative Example 3 | 0.152 | 0.025 | 0.263 | 0.164 | 55 | C |

TABLE 3

| | | Example 1 | Example 2 | Example 3 | Example 4 | Example 5 | Example 6 | Comp. Example 1 | Comp. Example 2 | Comp. Example 3 | Comp. Example 4 |
|---|---|---|---|---|---|---|---|---|---|---|---|
| Bottom | | Photo-sensitive resin laminate 1 | Photo-sensitive resin laminate 1 | Photo-sensitive resin laminate 1 | Acrylic resin | Photo-sensitive resin laminate 1 | Photo-sensitive resin laminate 1 | Acrylic resin | Acrylic resin | Photo-sensitive resin laminate 1 | Silicon wafer |
| Seal surface | | Sealant | Sealant | Sealant | Sealant | Photo-sensitive resin laminate 2 | Sealant | Sealant | Sealant | Sealant | Sealant |
| Partition surface | | Photo-sensitive resin laminate 1 | Photo-sensitive resin laminate 1 | Photo-sensitive resin laminate 1 | Photo-sensitive resin laminate 1 | Photo-sensitive resin laminate 1 | Photo-sensitive resin laminate 1 | Photo-sensitive resin laminate 1 | Photo-sensitive resin laminate 1 | Photo-sensitive resin laminate 1 | Photo-sensitive resin laminate 1 |
| Developing solution | | 2.38% TMAH | 2.38% TMAH | 3% DMAE | 2.38% TMAH | 2.38% TMAH | 2.38% TMAH | 2.38% TMAH | 1% $Na_2CO_3$ | 1% $Na_2CO_3$ | 2.38% TMAH |
| Curing temperature | [°C] | 135 | 135 | 135 | 135 | 135 | 135 | None | 135 | 135 | 135 |
| Curing time | [hr] | 2 | 6 | 6 | 6 | 6 | 6 | None | 6 | 0.5 | 6 |
| Aa/Ac | | 0.081 | 0.005 | 0.020 | 0.005 | 0.005 | 0.005 | 0.359 | 0.240 | 0.263 | 0.005 |
| w | [μm] | 700 | 700 | 700 | 700 | 700 | 700 | 700 | 700 | 700 | 700 |
| Θb | [deg] | 71 | 71 | 71 | 68 | 71 | 71 | 68 | 68 | 55 | 30 |
| w | [μm] | 700 | 700 | 700 | 700 | 700 | 700 | 700 | 700 | 700 | 700 |
| Θs | [deg] | 104 | 104 | 104 | 104 | 90 | 104 | 104 | 104 | 104 | 104 |
| h | [μm] | 720 | 720 | 720 | 720 | 720 | 120 | 720 | 720 | 720 | 720 |
| Θ | [deg] | 64 | 71 | 68 | 71 | 71 | 71 | 38 | 59 | 55 | 71 |
| P | | 1369 | 1046 | 1186 | 1114 | 1382 | 1627 | 2436 | 1656 | 2099 | 1797 |
| Capillary action | | A | A | A | A | A | B | C | C | C | C |

INDUSTRIAL APPLICABILITY

The present invention can be utilized in fields related to structures comprising microchannels, to processes for their production, and to microfluidic devices.

REFERENCE SIGNS LIST

1: Microfluidic device
10: Structure
11: Base material
11A: First layer
11B: Second layer
11*a*: Flow channel-forming surface of substrate
12: Partition material
12*a*: Flow channel-forming surface of partition material
13: Cover material
13*a*: Flow channel-forming surface of cover material
14: Microchannel
15: Flow channel pattern (microchannel pattern for weighing)
16: Resin layer
17: Injection port
17*a*: Injection port pattern
18: Waste liquid port
18*a*: Waste liquid port pattern
19: Main flow channel pattern
20: Weighing flow channel patterns
20*a*: Long side
20*b*: Short side
20*c*: Flow channel pattern width
20*d*: Partition width
21: Resin region
22: Coating layer
AD: Adhesive layer
h: Length of flow channel-forming surface of partition material
w: Length of flow channel-forming surface of substrate
H: Length of flow channel

The invention claimed is:

1. A structure having a plurality of microchannels, wherein: the structure comprises:

a base material;
a partition material; and
a cover material;

wherein:

the base material, the partition material and the cover material form the plurality of microchannels;
the base material includes a flow-channel-forming surface having a water contact angle between 40 and 150°;
at least a portion of: the base material; and/or the partition material have a resin region obtained from an alkali-soluble resin;
the resin region exhibits, in infrared spectroscopy a first peak intensity (Aa) of absorption between 1555 and 1575 $cm^{-1}$, and a second peak intensity (Ac) between 1715 and 1735 $cm^{-1}$; and
the ratio (Aa/Ac) is greater than 0 and 0.200 or lower.

2. The structure according to claim 1, wherein the ratio (Aa/Ac) is greater than 0 and 0.100 or lower.

3. The structure according to claim 1, wherein the ratio (Aa/Ac) is greater than 0 and 0.085 or lower.

4. The structure according to claim 1, wherein the ratio (Aa/Ac) is greater than 0 and 0.050 or lower.

5. The structure according to claim 1, wherein the first peak intensity (Aa) includes an absorption intensity corresponding to stretching vibrations of carbonyl (C═O) bonds in carboxylates.

6. The structure according to claim 1, wherein the second peak intensity (Ac) includes an absorption intensity corresponding to stretching vibrations of carbonyl (C═O) bonds due to esters.

7. The structure according to claim 1, wherein the resin region exhibits, in infrared spectroscopy, a third peak intensity (Ad) between 1625 to 1645 $cm^{-1}$, and the ratio (Ad/Ac) is greater than 0 and 0.150 or lower.

8. The structure according to claim 7, wherein the third peak intensity (Ad) includes an absorption intensity corresponding to stretching vibrations of carbon-carbon (C═C) bonds occurring with carbon-carbon double bonds.

9. The structure according to claim 1, wherein the resin region lacks components derived from alkali metal salts.

10. The structure according to claim 1, wherein the water contact angle is between 60 and 130°.

11. The structure according to claim 1, wherein the resin region is derived from a (meth)acrylic resin.

12. The structure according to claim 1, wherein the resin region is derived from a photosensitive resin composition comprising:

an alkali-soluble polymer comprising a carboxyl group;
an addition polymerizable monomer; and
a photopolymerization initiator or a decomposition product of the photopolymerization initiator.

13. The structure according to claim 1, wherein the partition material includes the resin region.

14. The structure according to claim 1, wherein the resin region has a P (1/μm) value of 1650 $\mu m^{-1}$ or lower defined by:

$$P=\left(\frac{1}{h}\right)\cdot\cos\left(\left(\frac{\theta s}{180}\right)\cdot\pi\right)+\left(\frac{1}{h}\right)\cdot\cos\left(\left(\frac{\theta b}{180}\right)\cdot\pi\right)+\left(\frac{2}{w}\right)\cdot\cos\left(\left(\frac{\theta}{180}\right)\cdot\pi\right)\cdot 10^{6}$$

wherein

θs is the water contact angle on the flow channel-forming surface of the cover material in degrees;
θb is the water contact angle on the flow channel-forming surface of the base material in degrees;
θ is the water contact angle on the flow channel-forming surface of the partition material in degrees;
h is the length of the flow channel-forming surface of the partition material when the structure is cut along the thickness direction in micrometers;
w is the length of the flow channel-forming surface of the base material when the structure is cut along the thickness direction in micrometers.

15. A process for of producing the structure of claim 1, the method comprising:

coating a photosensitive resin composition solution containing a solvent having a boiling point of below 100 °C onto a support;
forming a photosensitive resin layer containing an alkali-soluble resin on the support by drying the coated support;
laminating the photosensitive resin layer onto a base material;
forming a flow channel pattern by developing the laminated photosensitive resin layer using an aqueous organic base solution; and forming a resin region obtained from the alkali-soluble resin by surface-treating the flow channel pattern by heat treating the flow channel pattern.

16. The process according to claim 15, wherein the forming a flow channel pattern comprises exposing the photosensitive resin layer before the developing the laminated photosensitive resin layer.

17. The process according to claim 16, wherein the exposing the photosensitive resin layer comprises carrying out direct imaging exposure without a mask during the exposing the photosensitive resin layer.

18. The process according to claim 15, further comprising, after the forming a resin region, forming a cover material by laminating the photosensitive resin layer.

19. A microfluidic device comprising the structure according to claim 1.

20. The microfluidic device according to claim 19, further comprising:

a second base material comprising a plurality of electrodes and;

an electrode protective layer disposed on the second base material; wherein the structure is layered on the second base material or on the electrode protective layer or both.

* * * * *